(12) United States Patent
Moll et al.

(10) Patent No.: US 7,687,343 B2
(45) Date of Patent: Mar. 30, 2010

(54) STORAGE CAPACITOR, A MEMORY DEVICE AND A METHOD OF MANUFACTURING THE SAME

(75) Inventors: Peter Moll, Dresden (DE); Peter Baars, Dresden (DE); Till Schloesser, Dresden (DE); Rolf Weis, Dresden (DE); Klaus Muemmler, Dresden (DE)

(73) Assignee: Qimonda AG, Munich (DE)

( * ) Notice: Subject to any disclaimer, the term of this patent is extended or adjusted under 35 U.S.C. 154(b) by 374 days.

(21) Appl. No.: 11/633,090

(22) Filed: Dec. 4, 2006

(65) Prior Publication Data

US 2008/0128773 A1    Jun. 5, 2008

(51) Int. Cl.
*H01L 21/8242* (2006.01)
(52) U.S. Cl. .............................. 438/239; 257/E21.649
(58) Field of Classification Search ......... 438/243–248, 438/386–387, 239; 257/301–306, E21.649, 257/E27.088
See application file for complete search history.

(56) References Cited

U.S. PATENT DOCUMENTS

| | | | |
|---|---|---|---|
| 5,895,239 | A | 4/1999 | Jeng et al. |
| 5,907,788 | A | 5/1999 | Kasai |
| 6,100,138 | A | 8/2000 | Tu |
| 6,127,220 | A | 10/2000 | Lange et al. |
| 6,410,385 | B2 * | 6/2002 | Kurth et al. .................. 438/253 |
| 6,511,878 | B1 | 1/2003 | Matsumura |
| 6,690,053 | B2 | 2/2004 | Amo et al. |
| 2004/0077143 | A1 | 4/2004 | Lee et al. |
| 2005/0118760 | A1 | 6/2005 | Fishburn et al. |
| 2006/0094186 | A1 | 5/2006 | Mitani |
| 2006/0226461 | A1 | 10/2006 | Shinkawata |

FOREIGN PATENT DOCUMENTS

KR    10-2004-0006318    1/2004

OTHER PUBLICATIONS

U.S. Appl. No. 11/039,740, Weis.
U.S. Appl. No. 11/128,423, Baars, et al.
Lee et al., "Robust Memory Cell Capacitor Using Multi-Stack Storage Node for High Performance in 90 nm Technology and Beyond," Symposium on VLSI Technologies 2003.

* cited by examiner

*Primary Examiner*—David Vu
(74) *Attorney, Agent, or Firm*—Edell, Shapiro & Finnan, LLC

(57) ABSTRACT

A storage capacitor includes a first capacitor portion and a second capacitor portion, the second capacitor portion being disposed above the first capacitor portion, thereby defining a first direction. The first and the second portions each include a hollow body made of a conductive material, respectively, thereby forming a first capacitor electrode. An upper diameter of each of the hollow bodies is larger than a lower diameter of the hollow body, the diameter being measured perpendicularly with respect to the first direction. The storage capacitor also includes a second capacitor electrode and a dielectric material disposed between the first and the second capacitor electrodes. The storage capacitor also includes an insulating material disposed outside the hollow bodies, and a layer of an insulating material. A lower side of the insulating layer is disposed at a height of an upper side of the first capacitor portion.

22 Claims, 32 Drawing Sheets

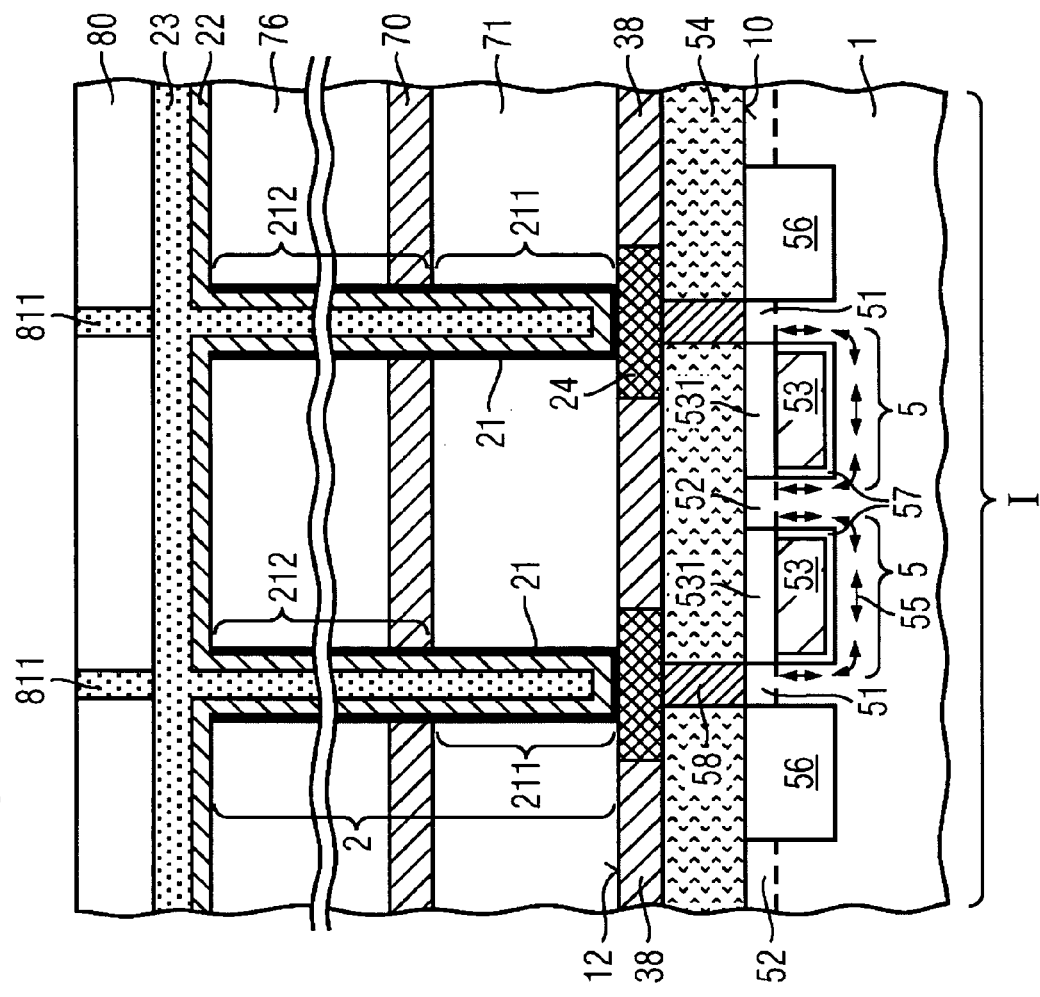
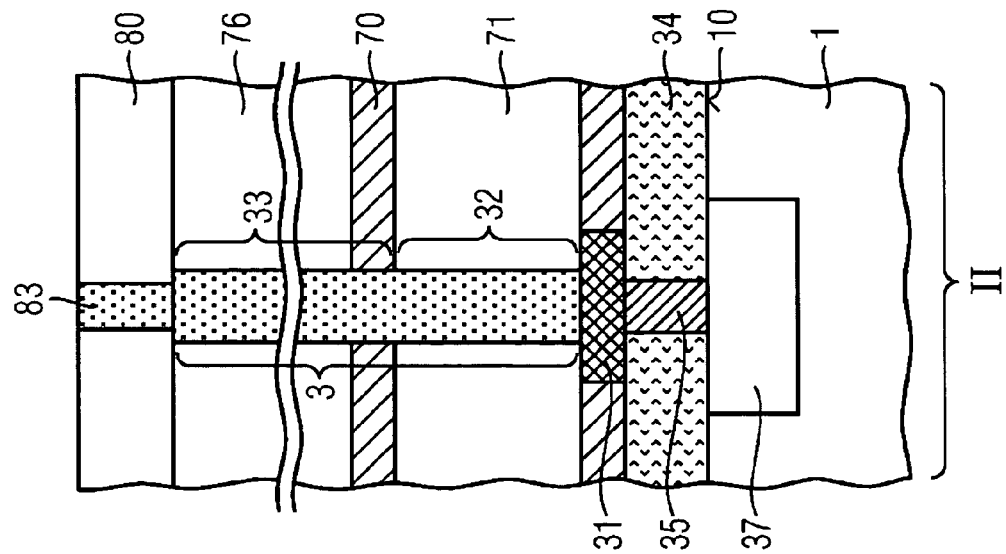

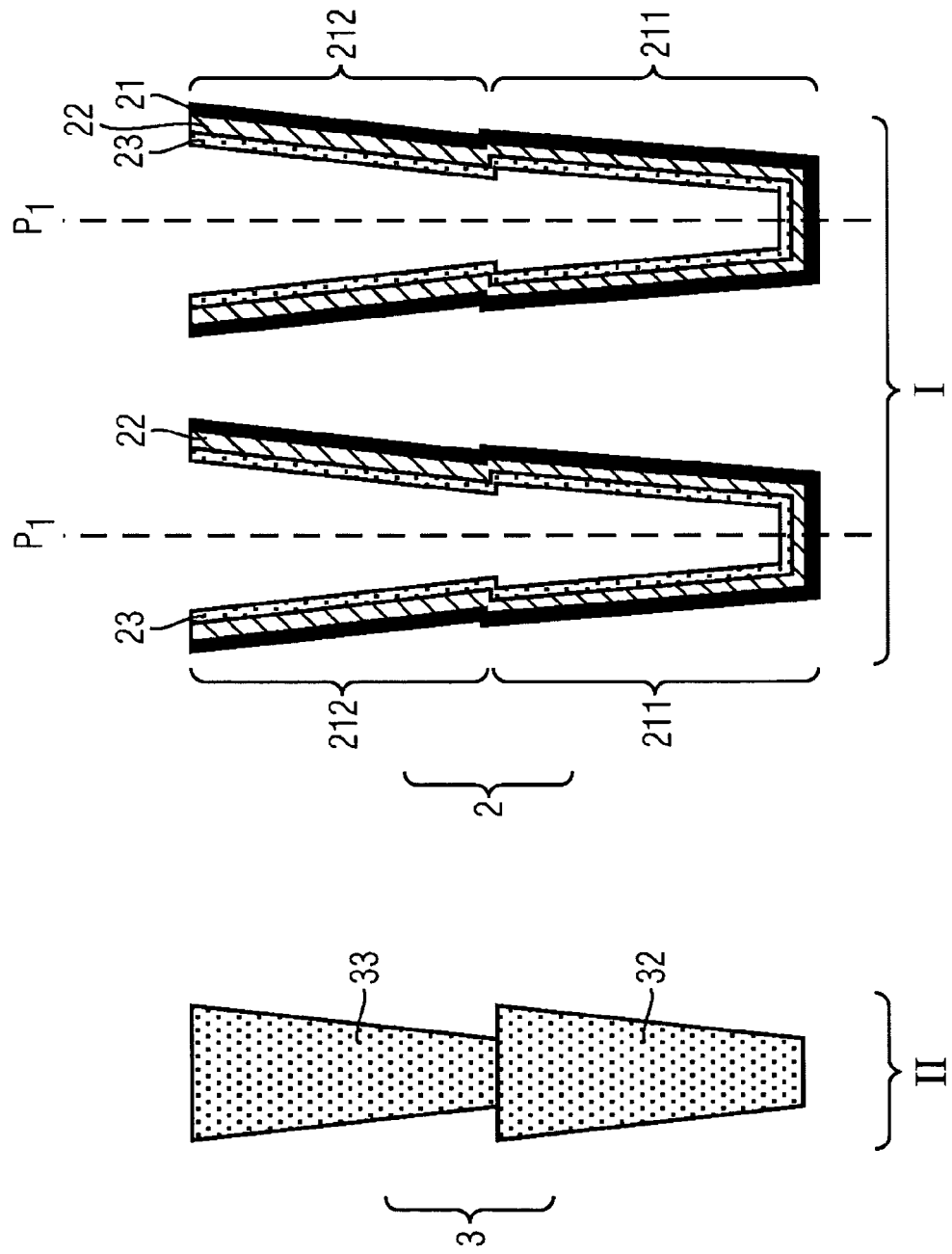

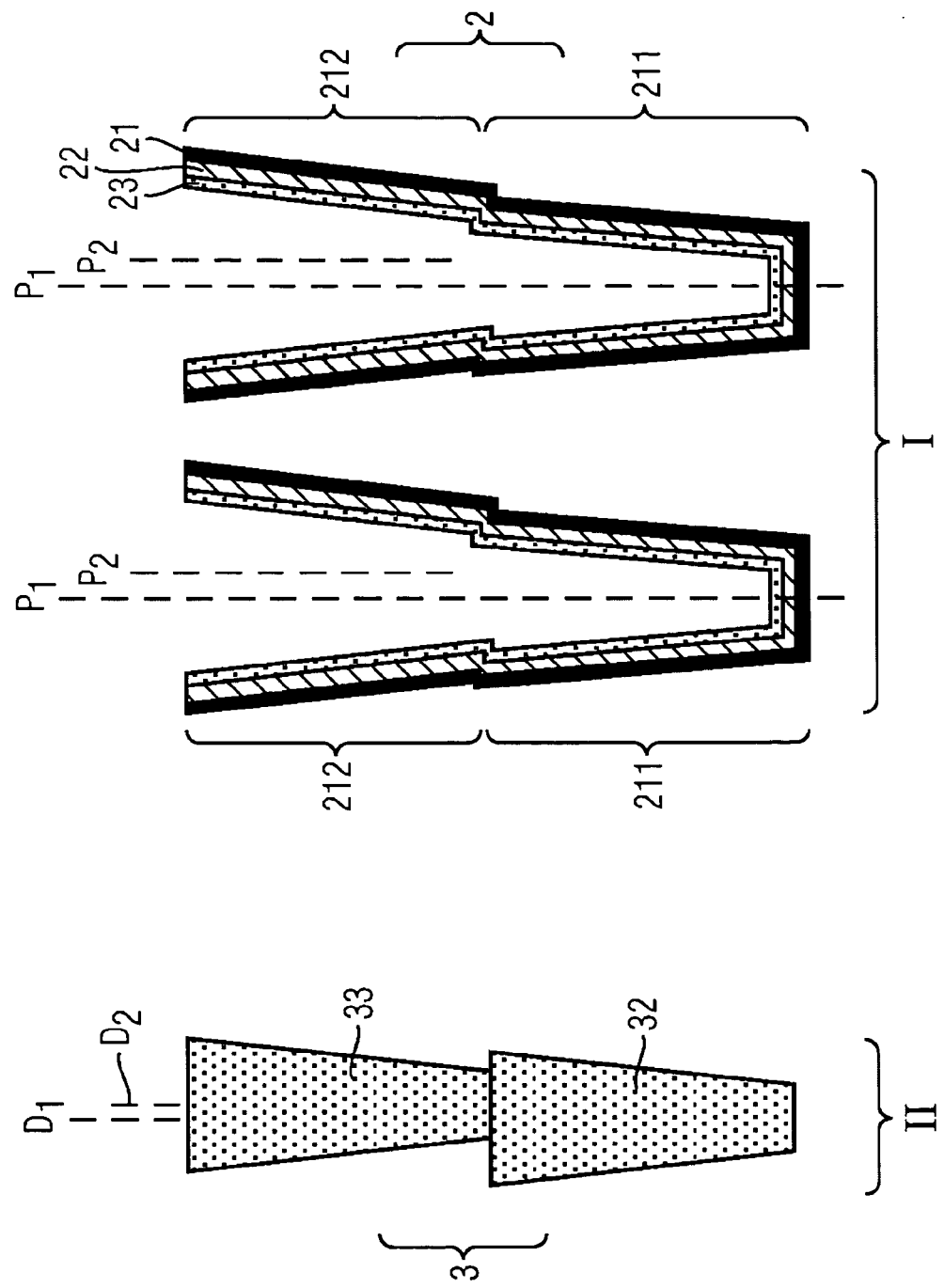

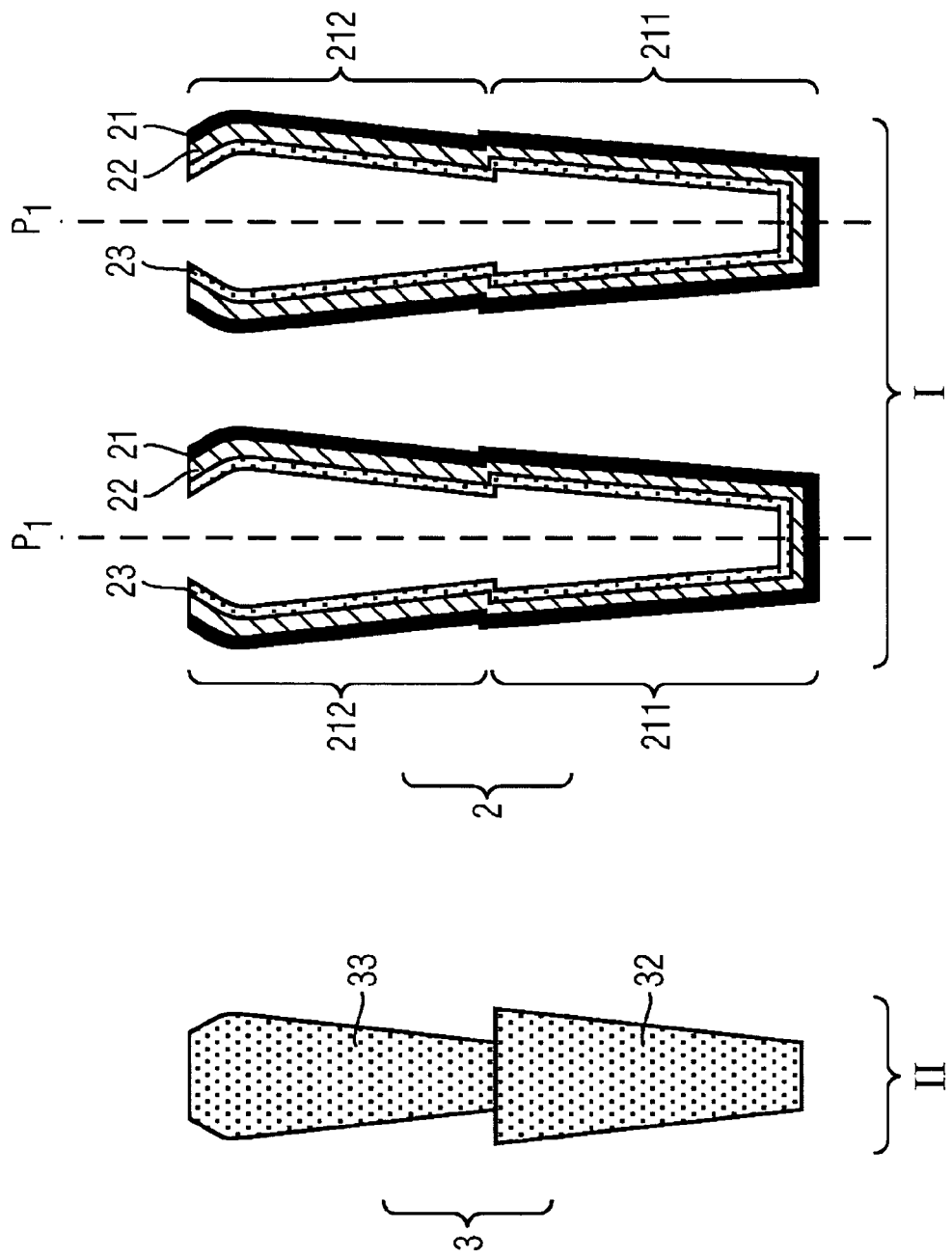

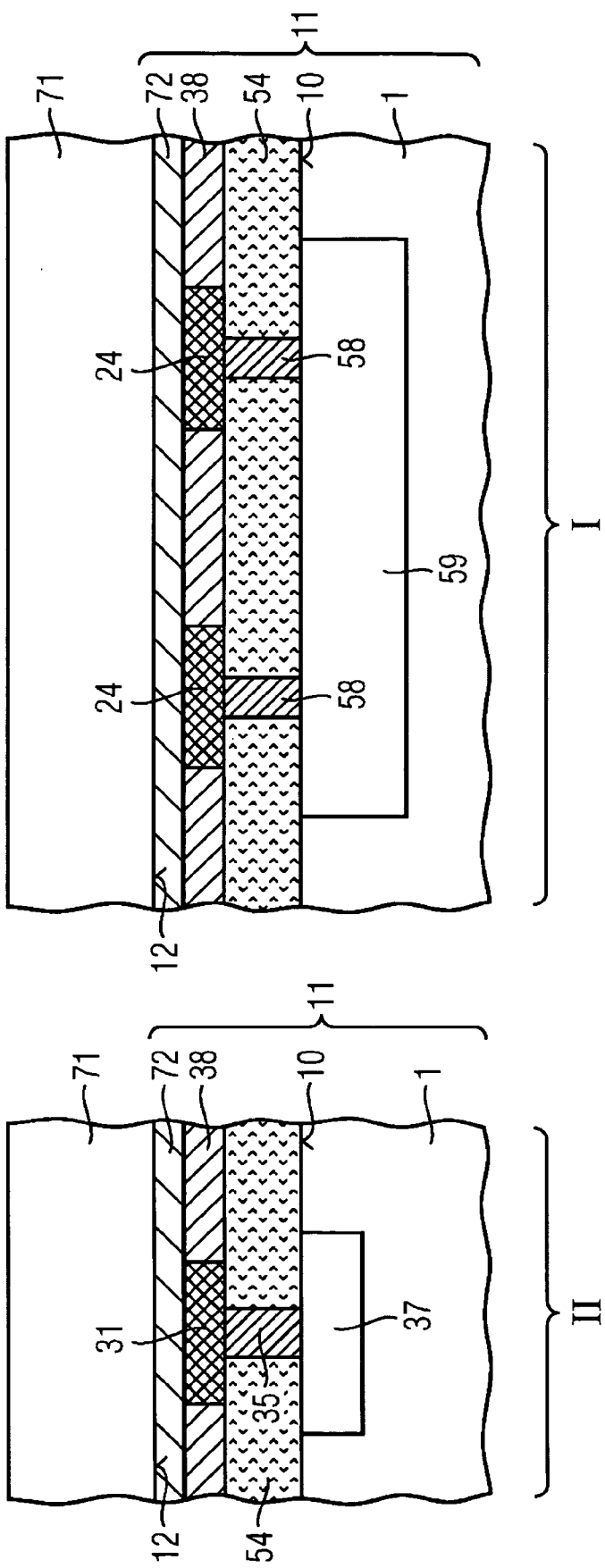

FIG 4
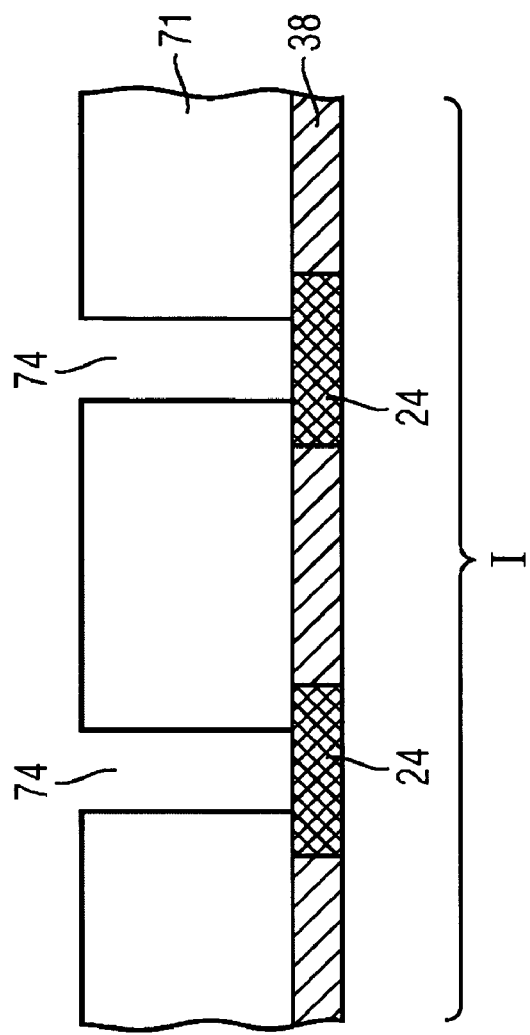
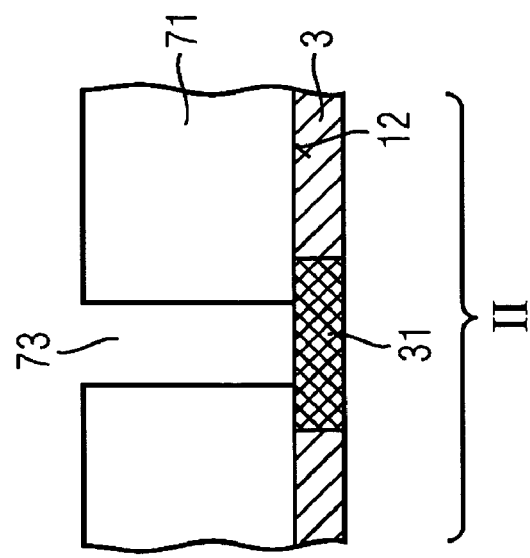

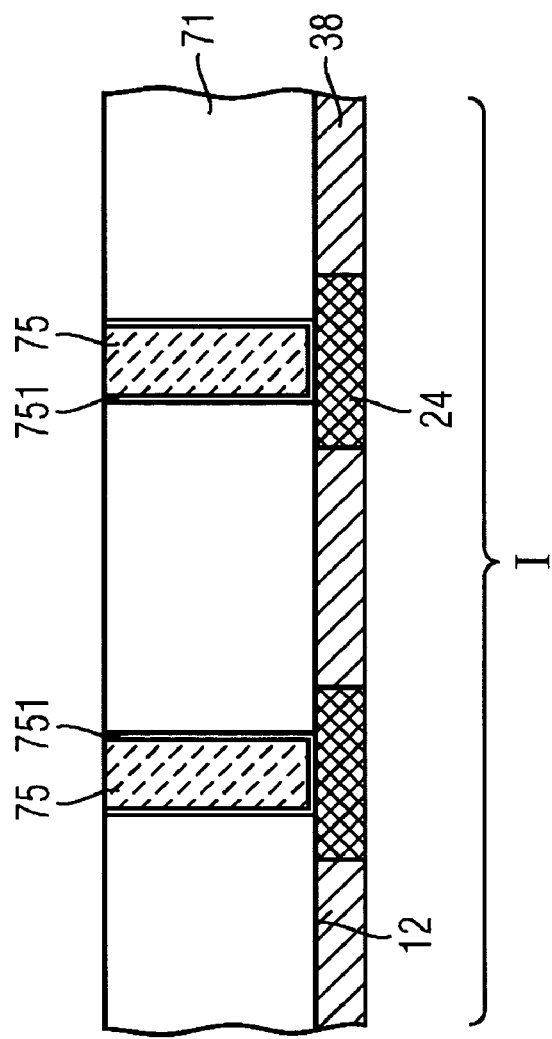
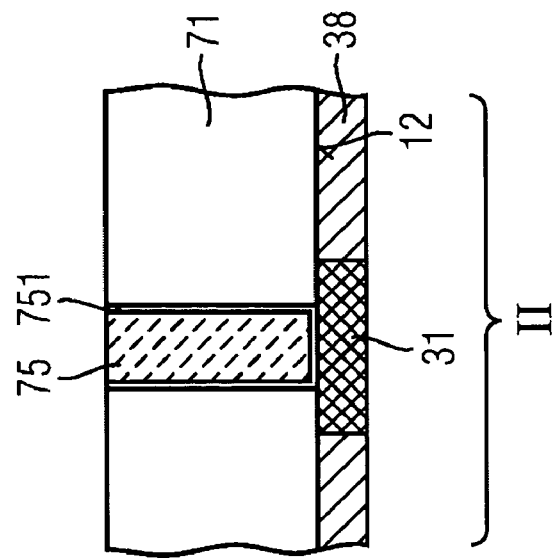
FIG 5

FIG 6
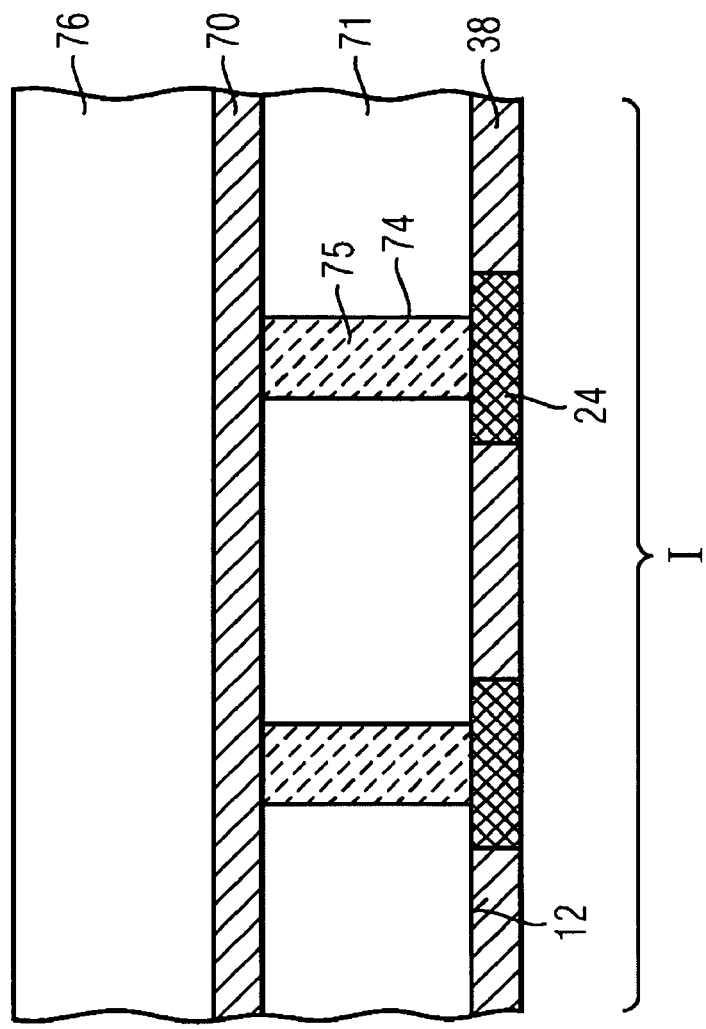
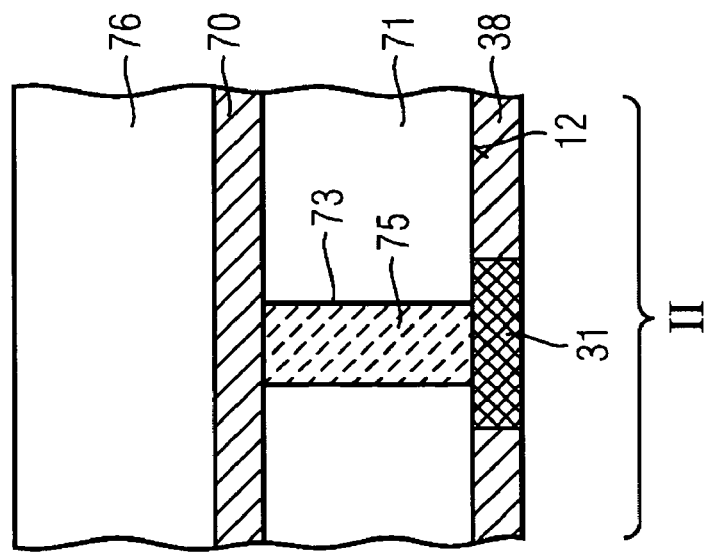

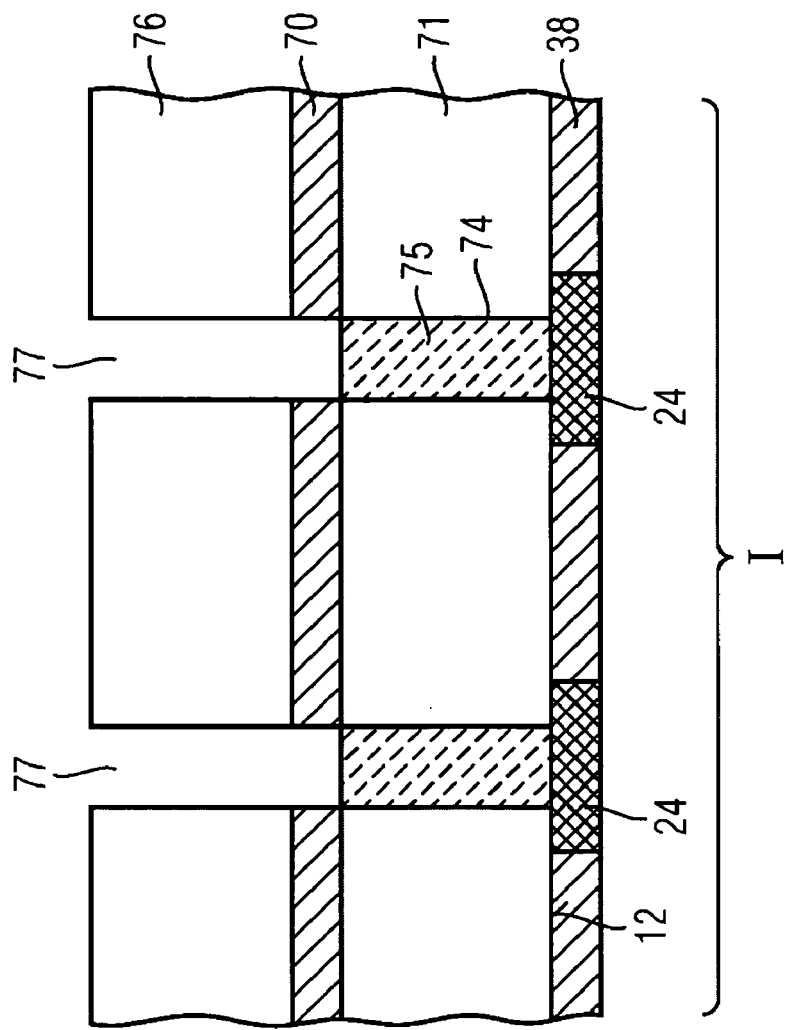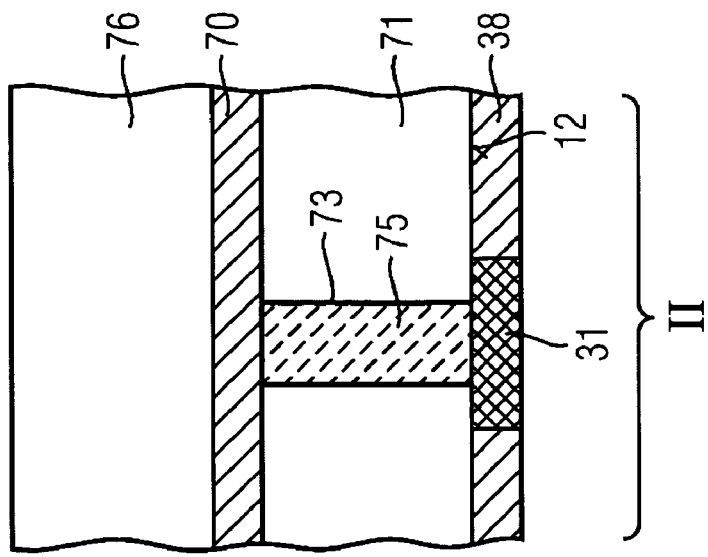
FIG 7

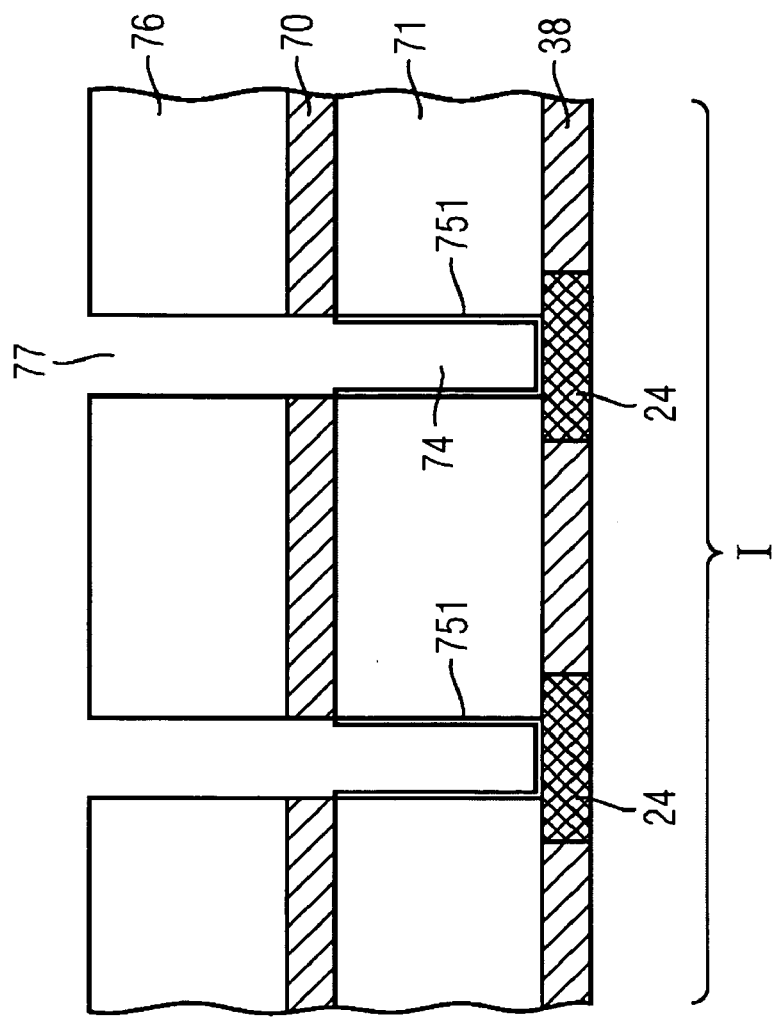
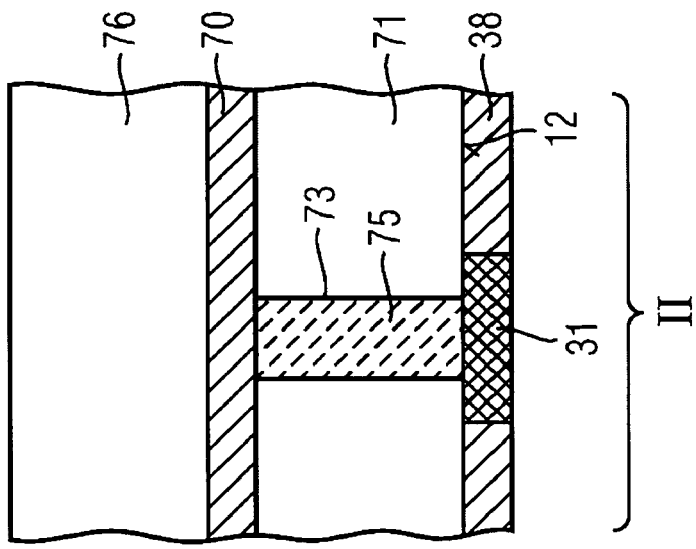
FIG 8

FIG 9
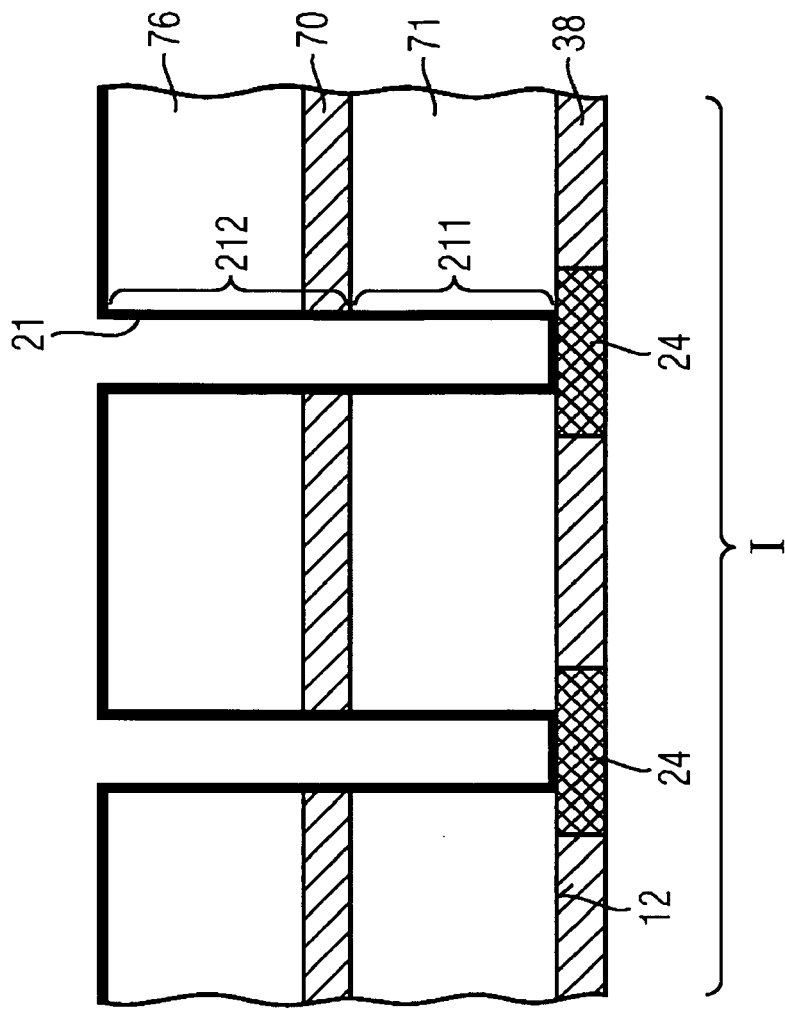
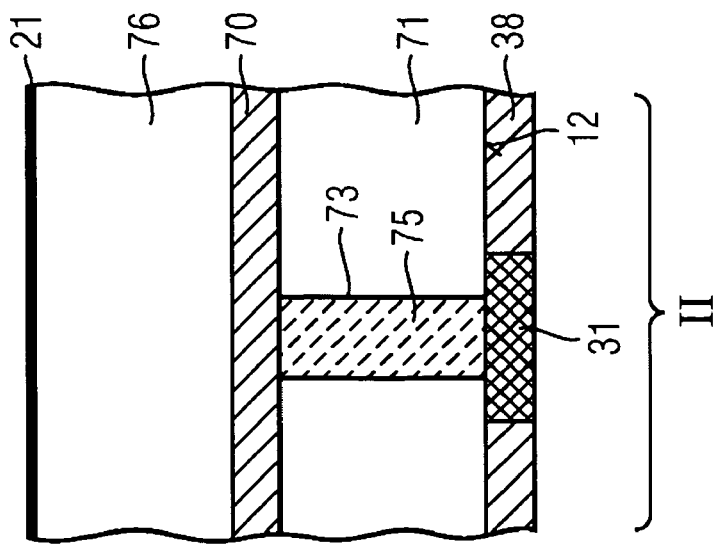

FIG 10
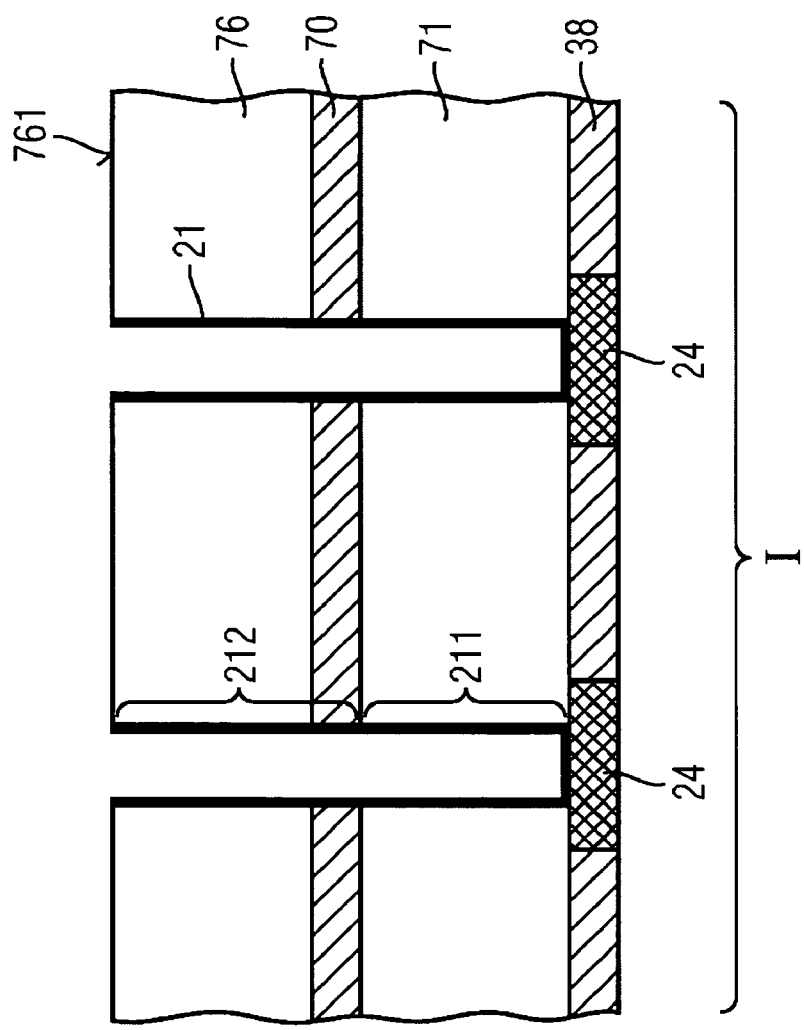
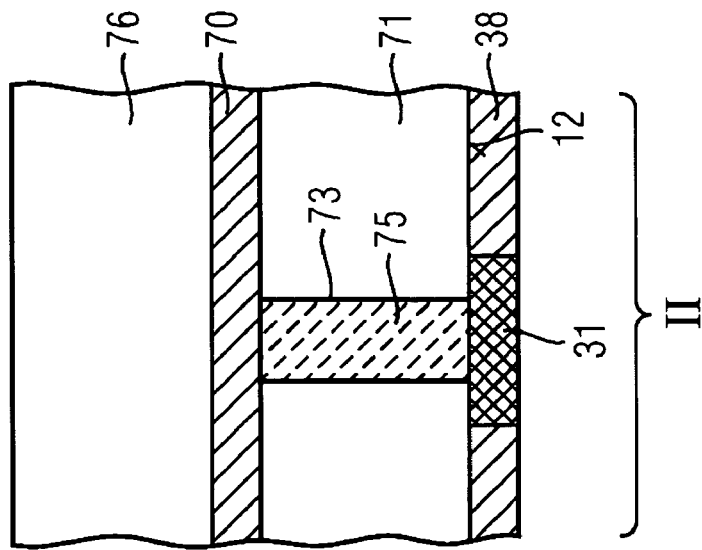

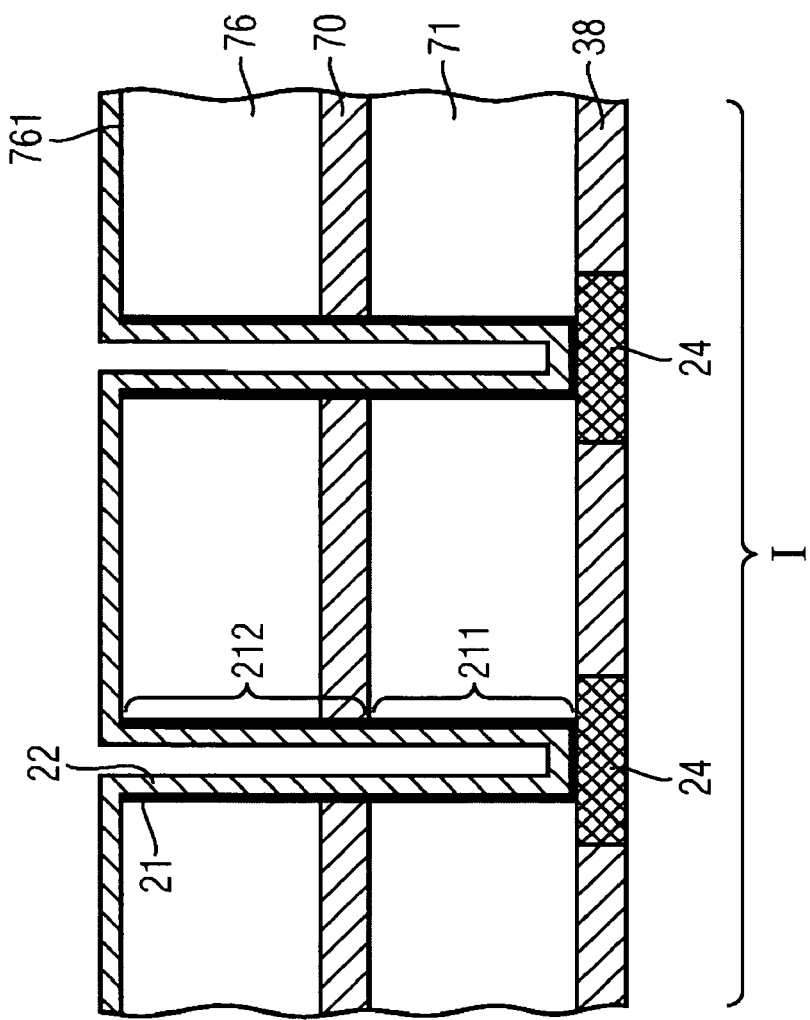
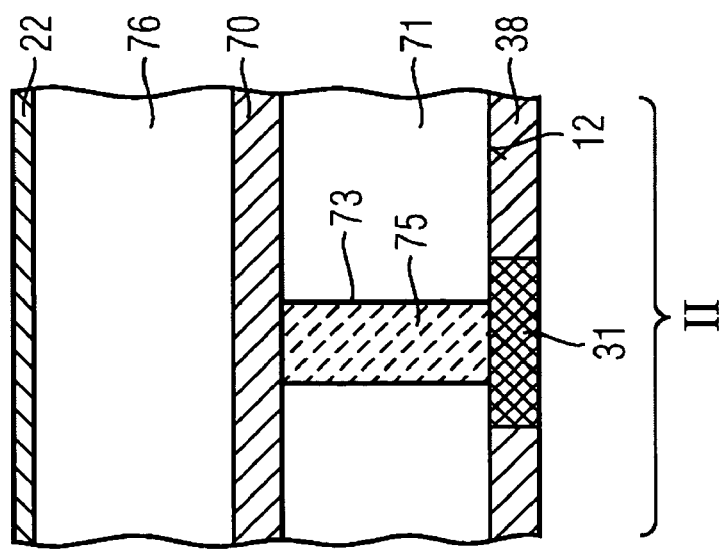
FIG 11

FIG 12
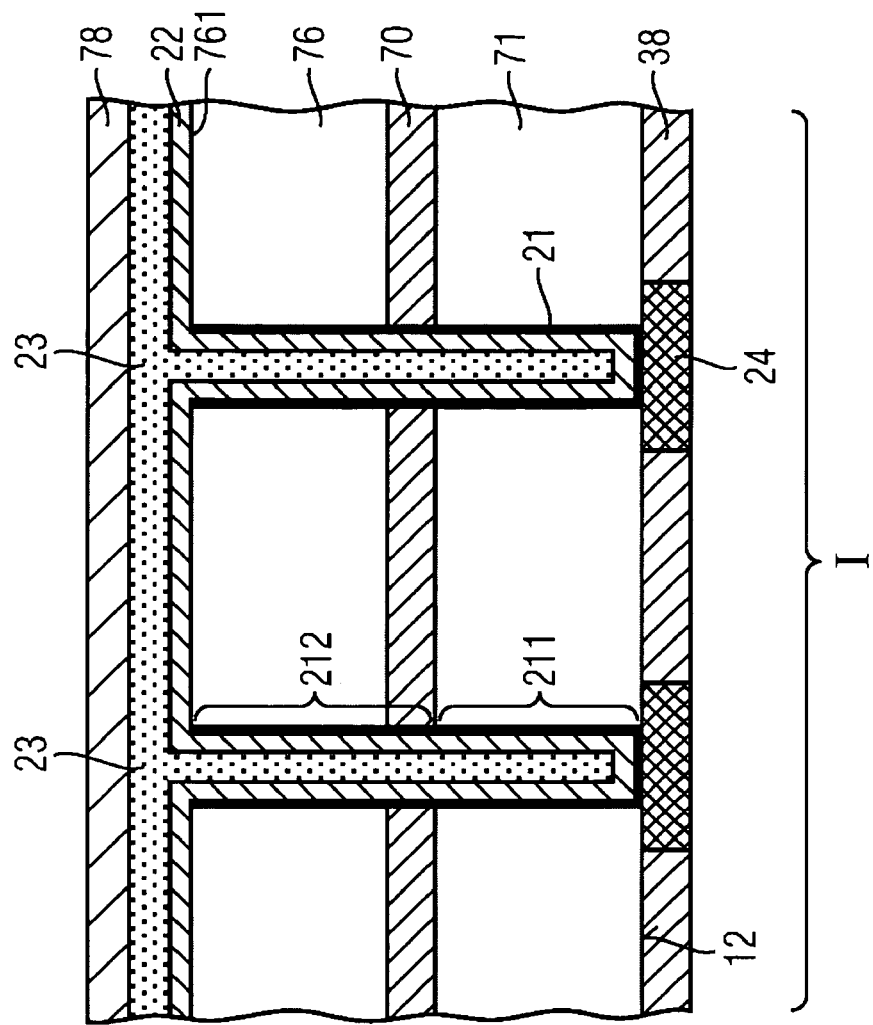
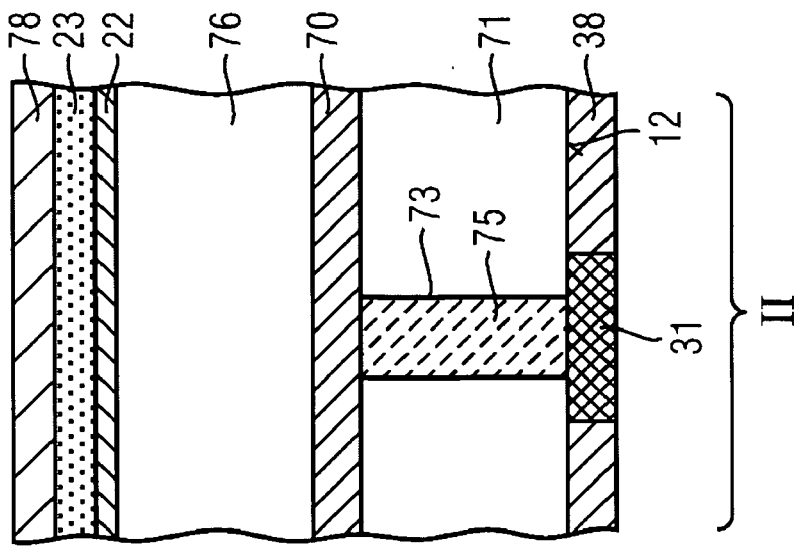

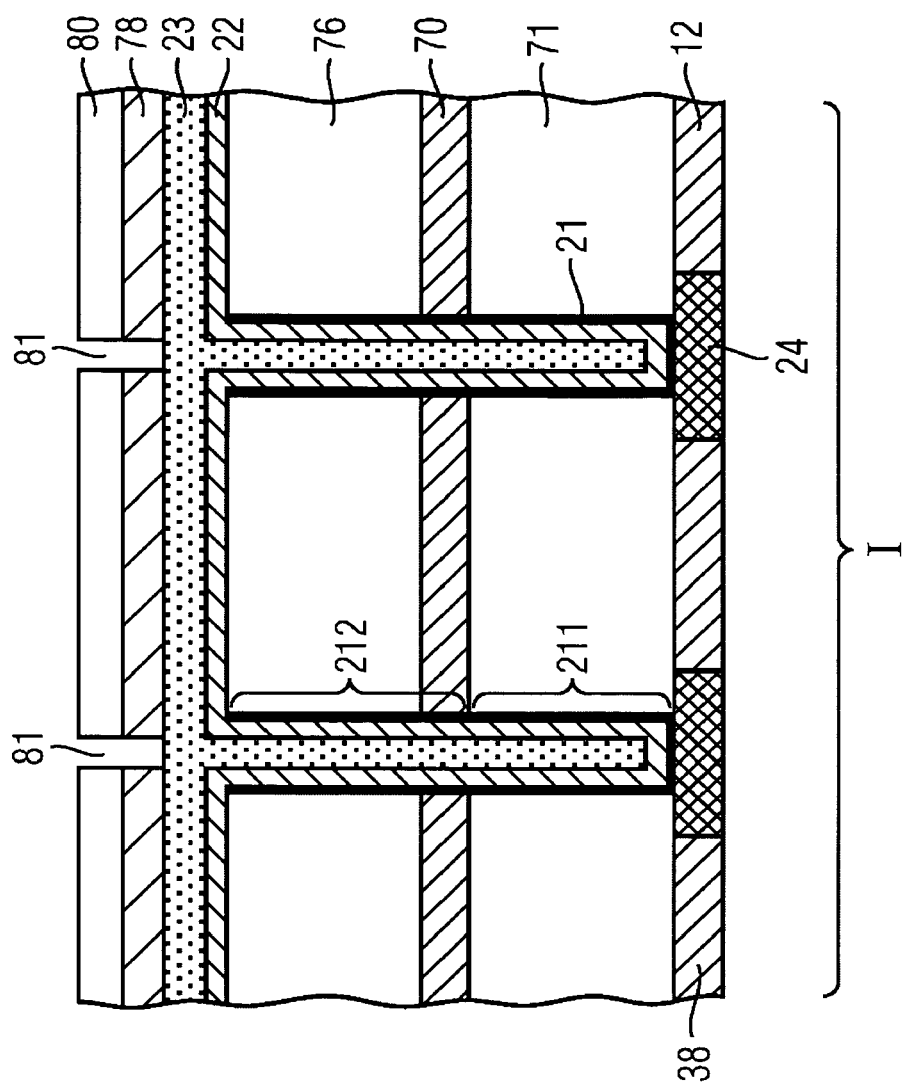
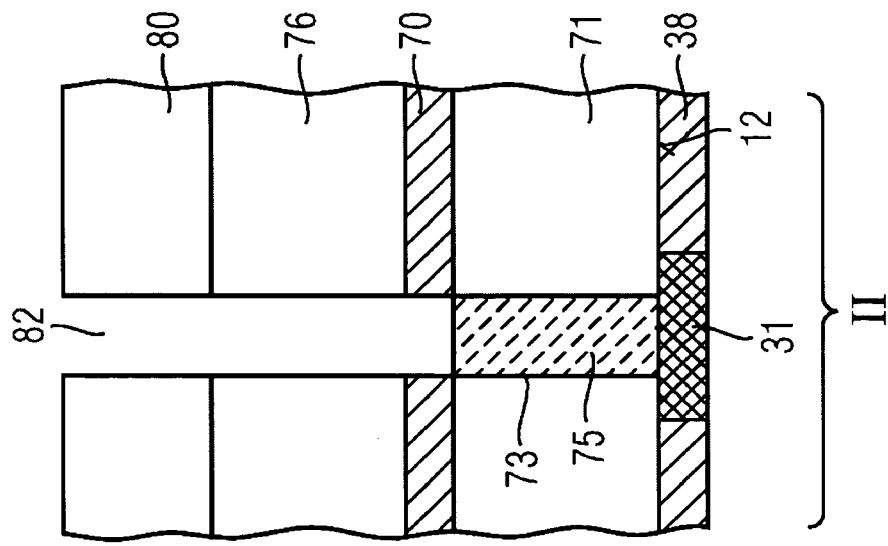
FIG 14

FIG 15
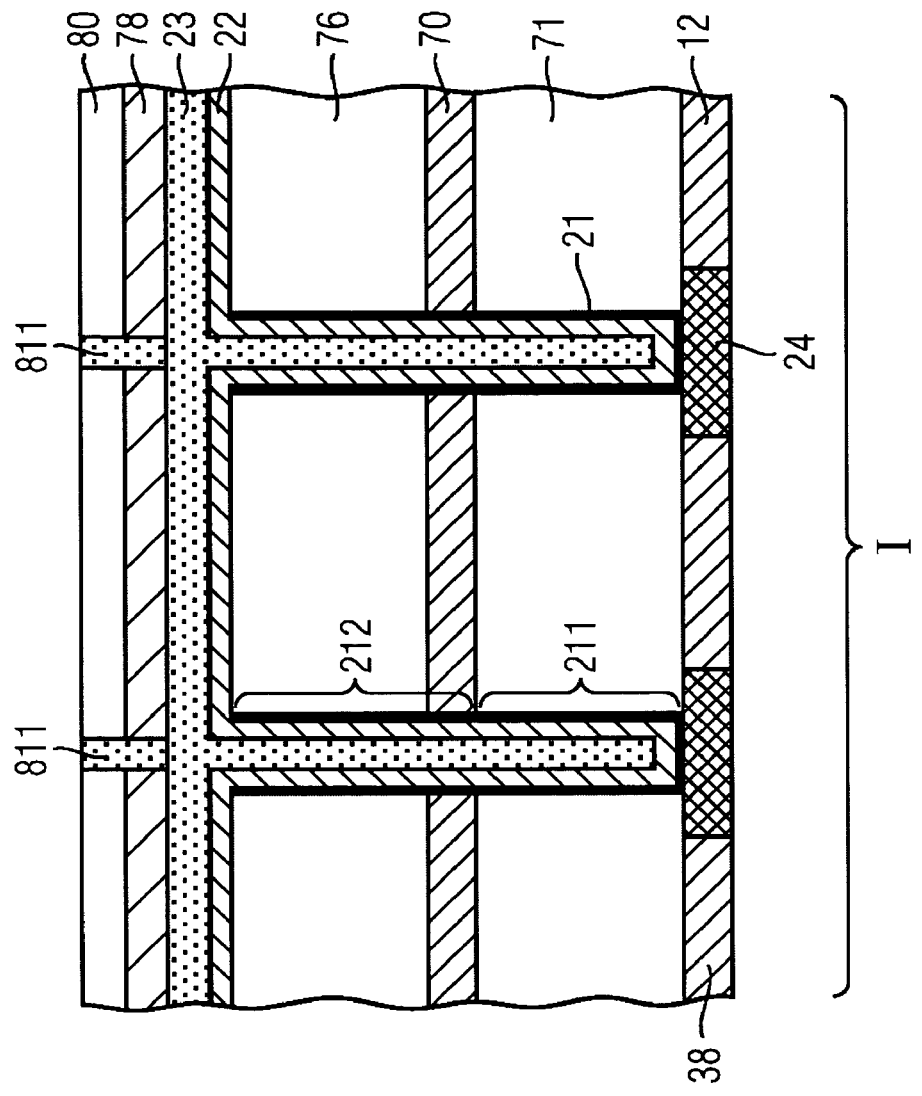
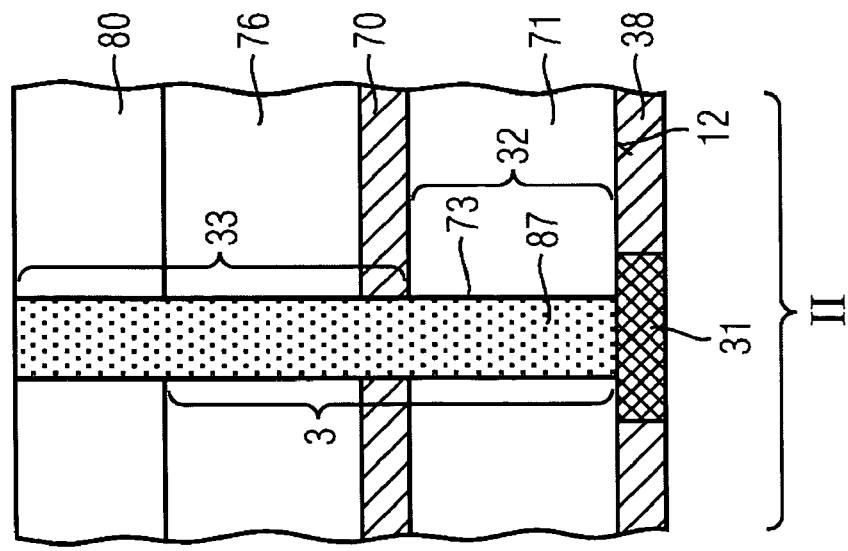

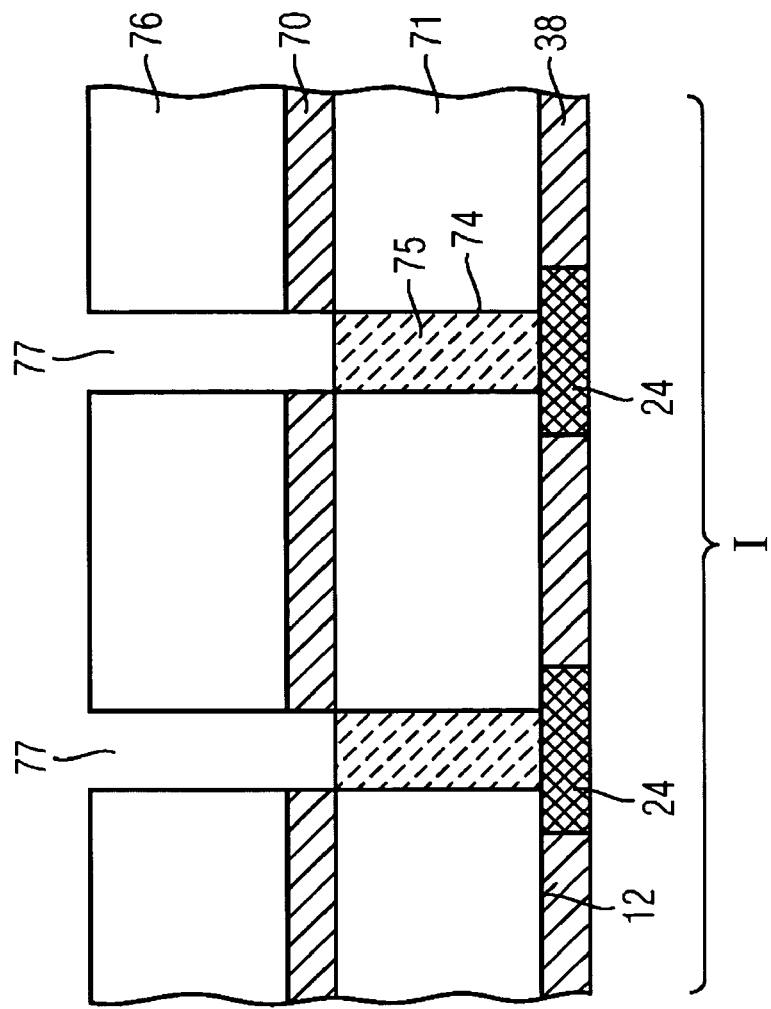
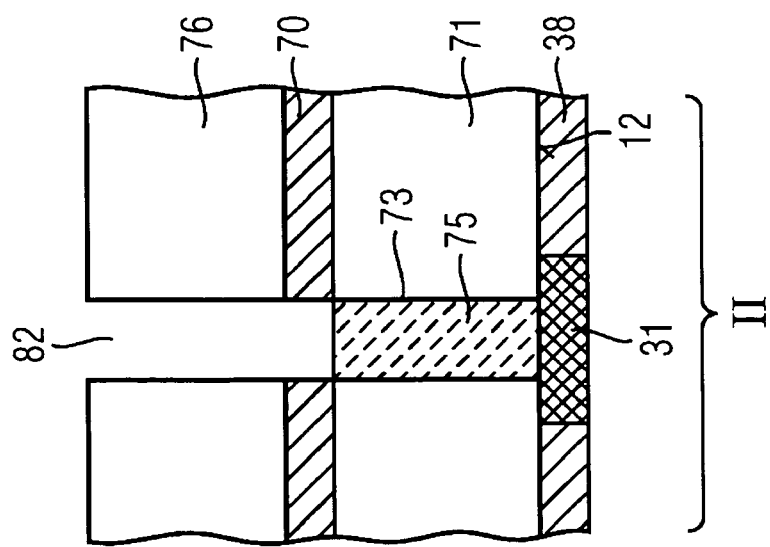
FIG 16

FIG 17
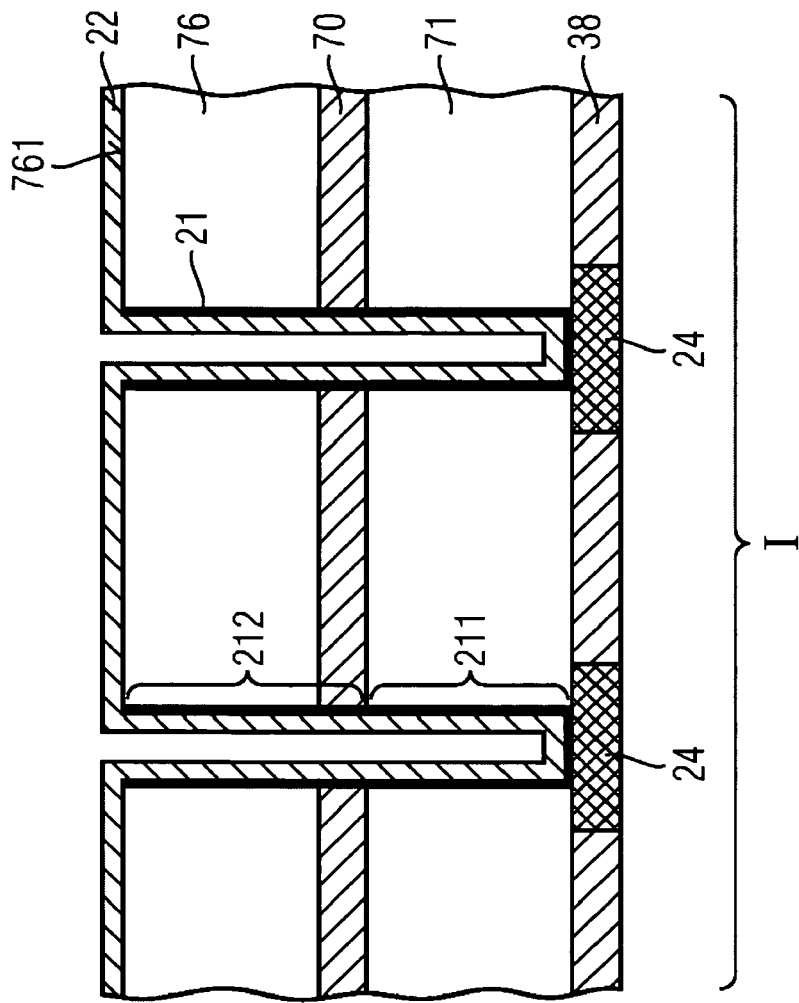
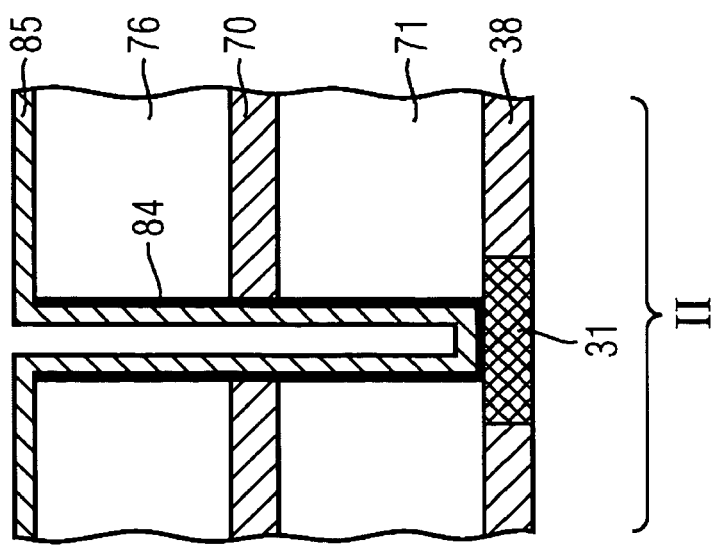

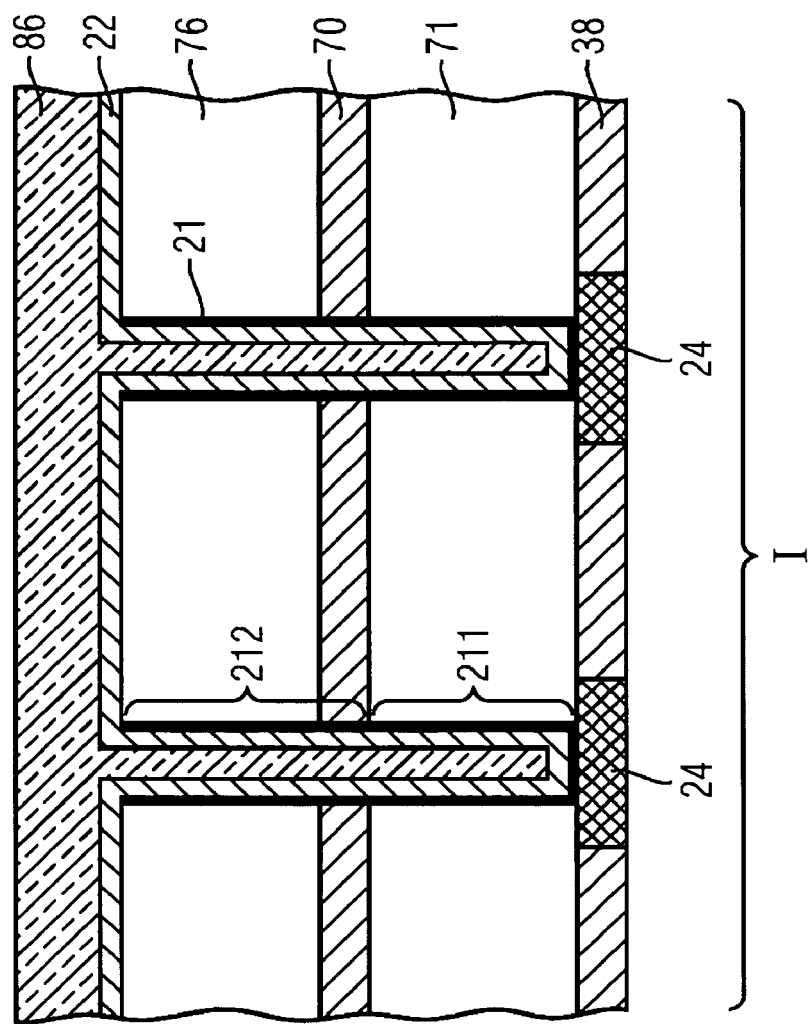
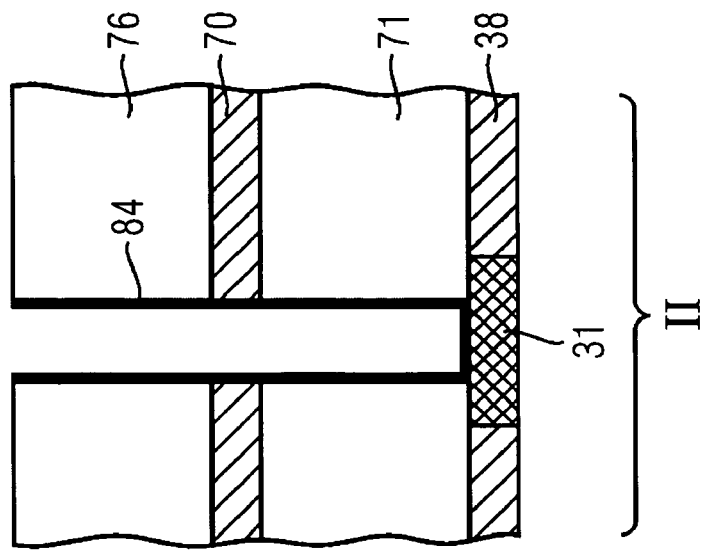
FIG 18

FIG 19
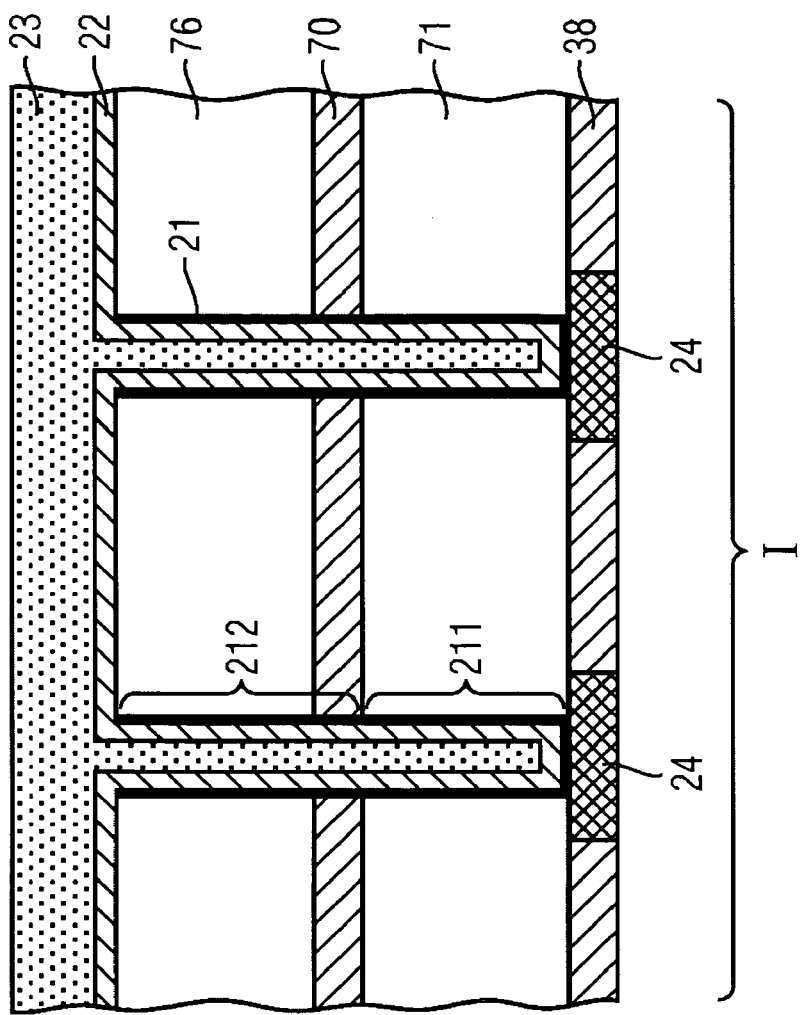
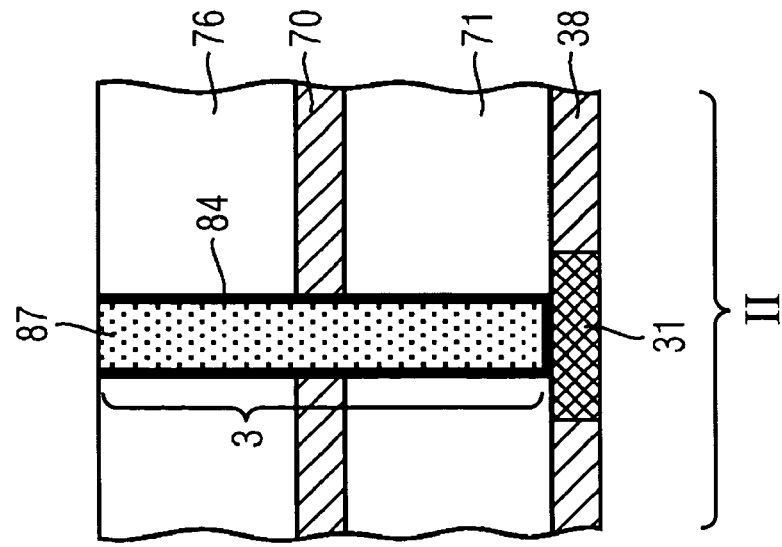

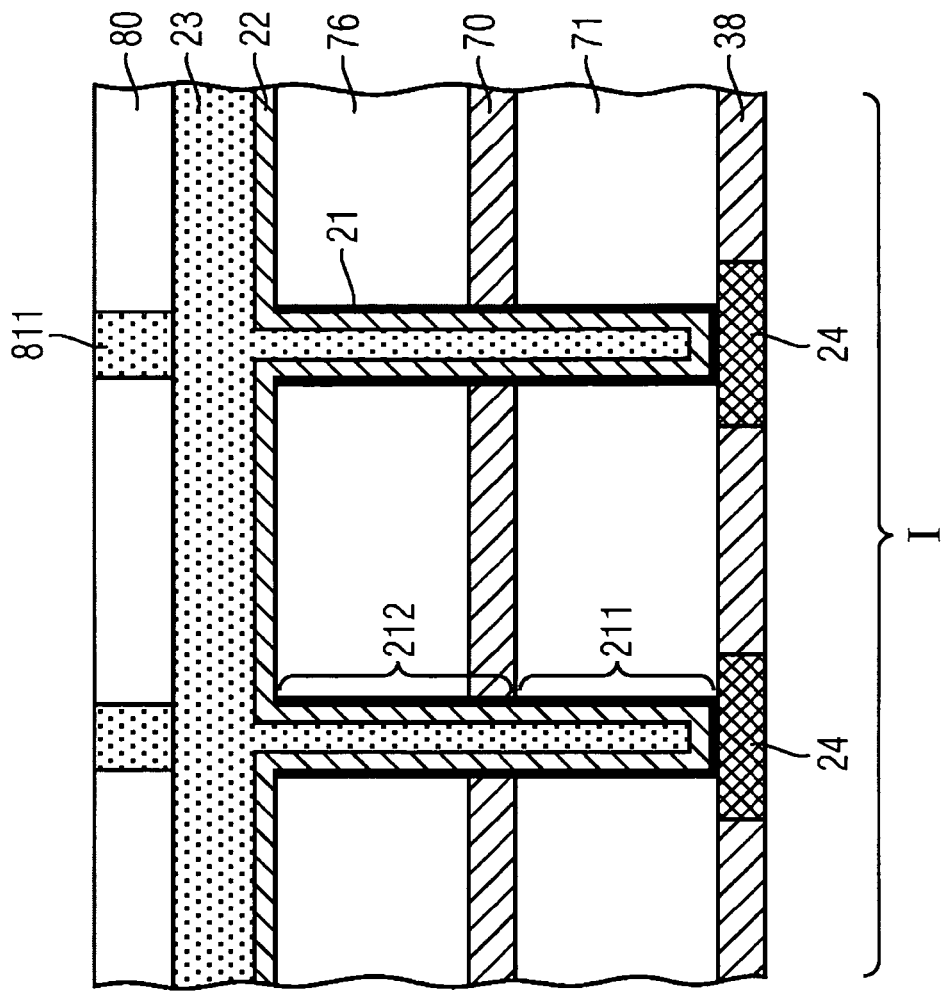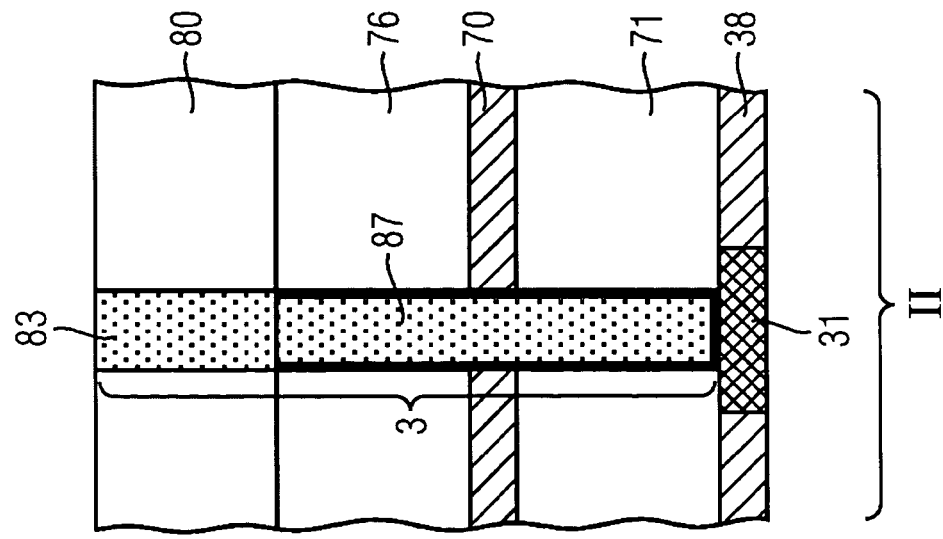
FIG 20

FIG 21
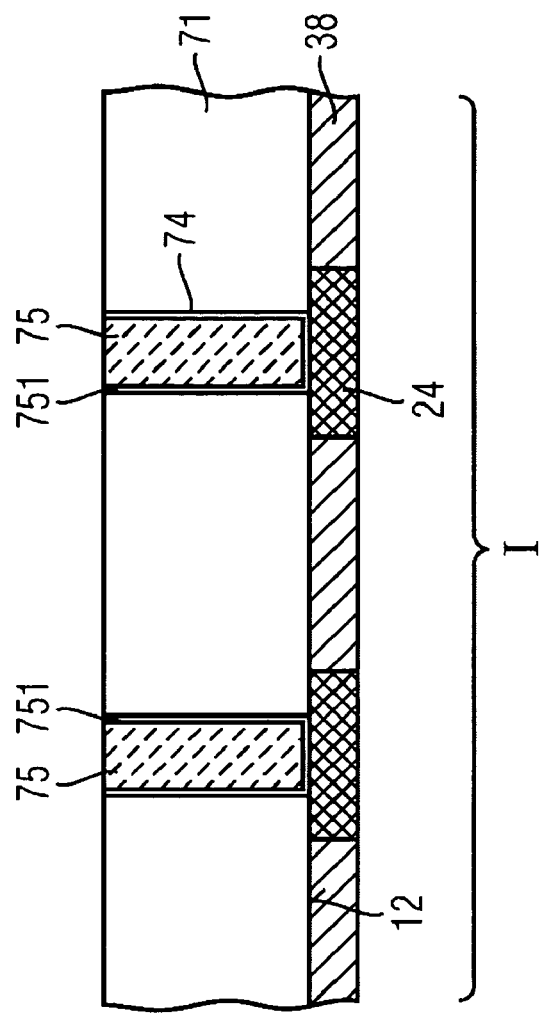
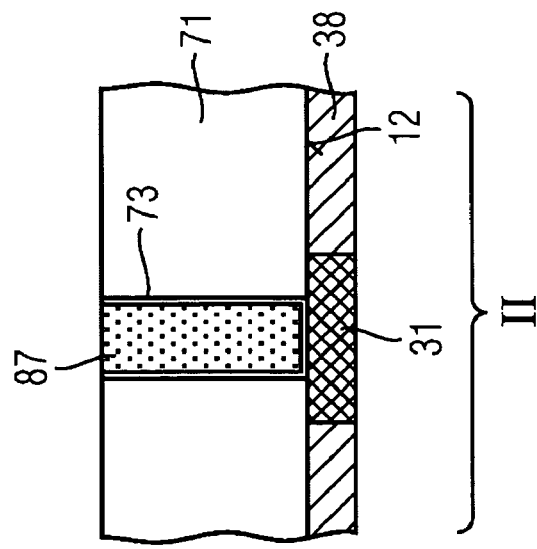

FIG 22
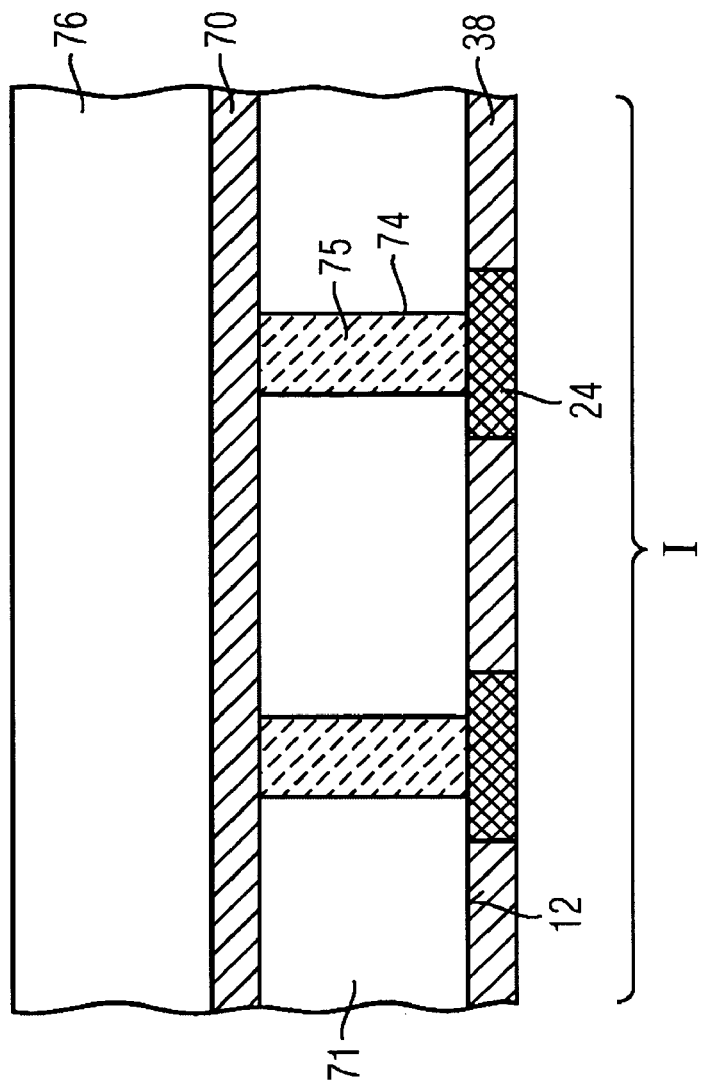
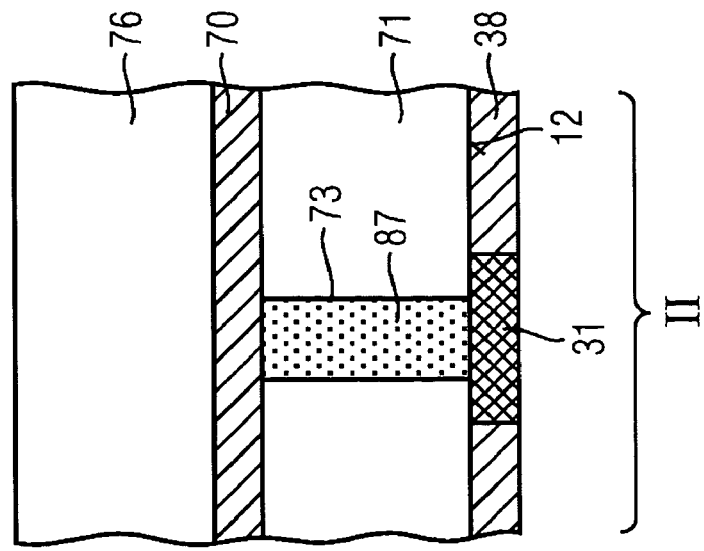

FIG 25
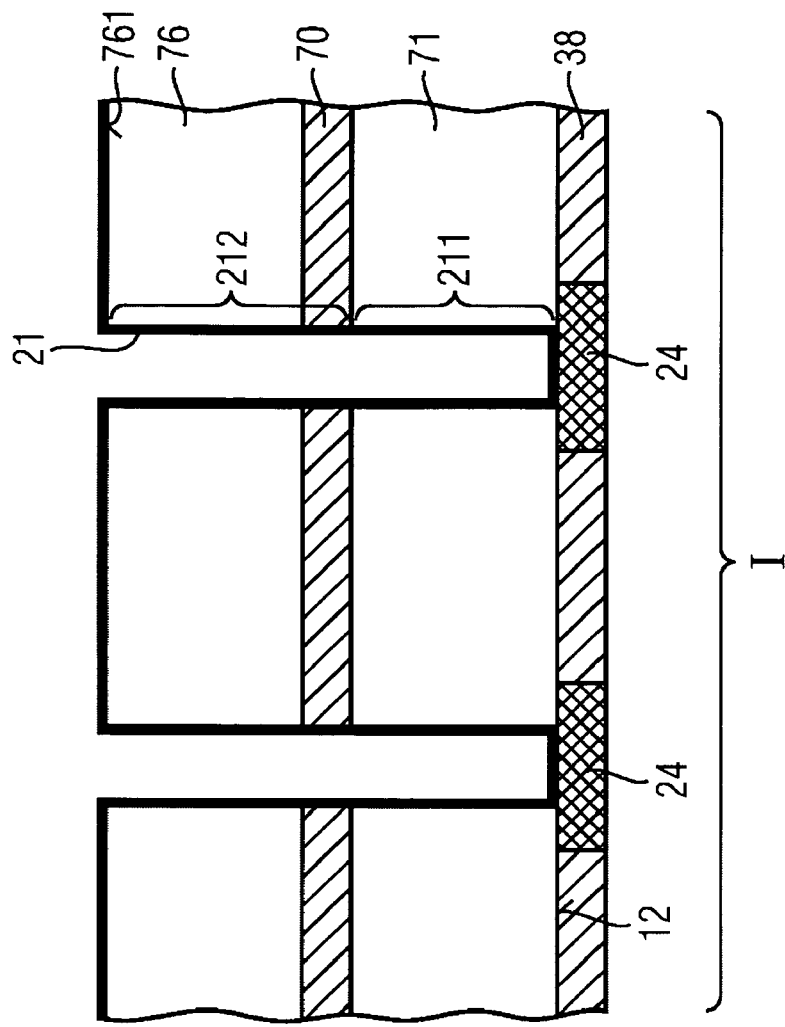
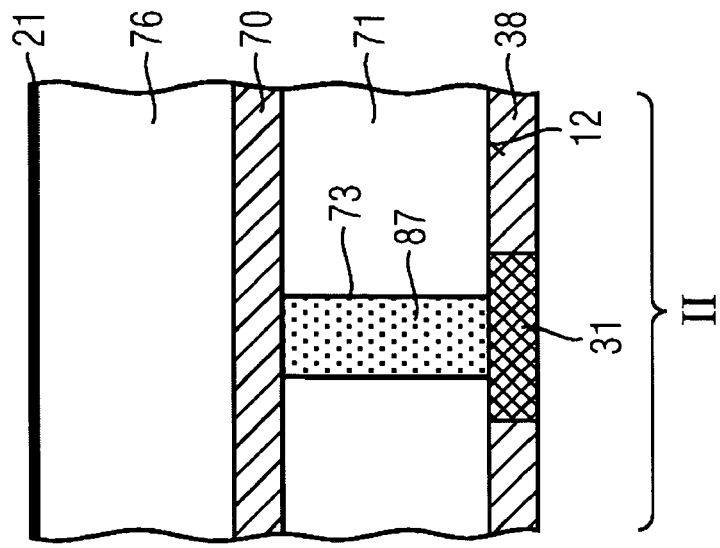

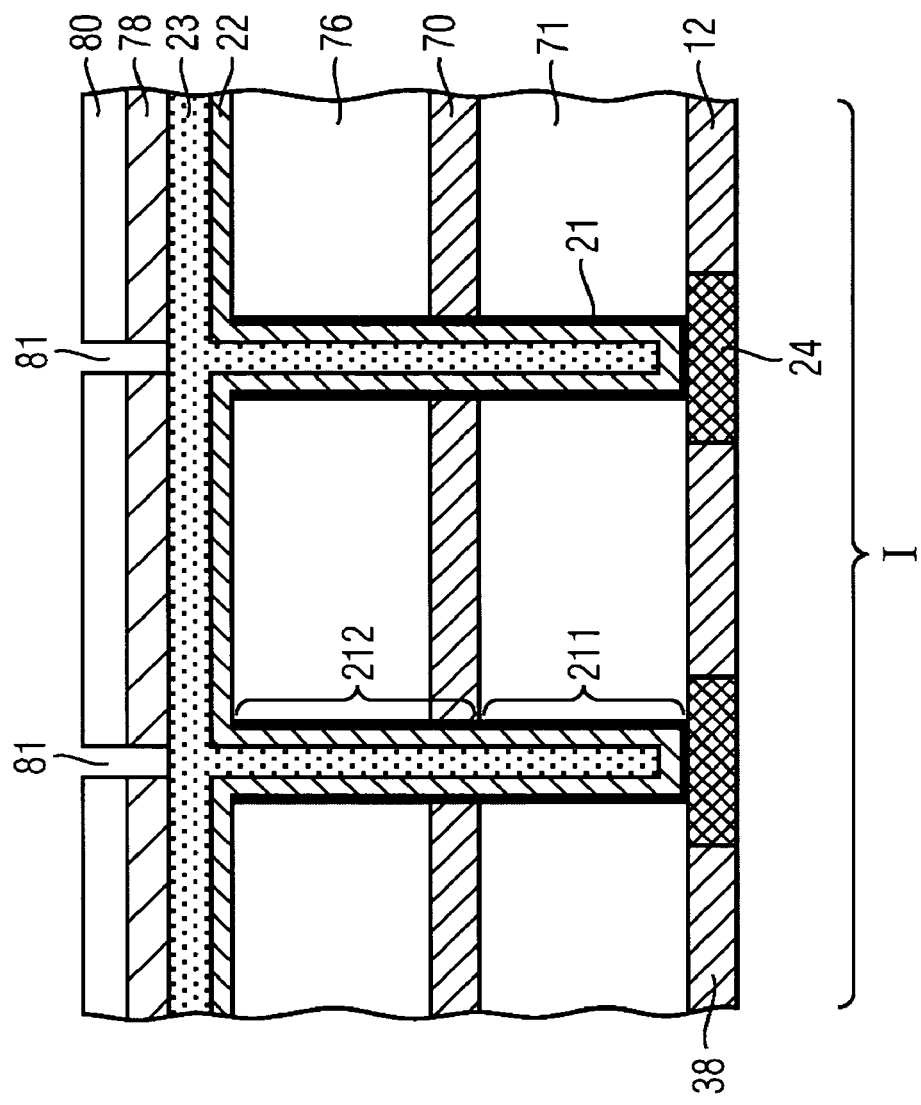
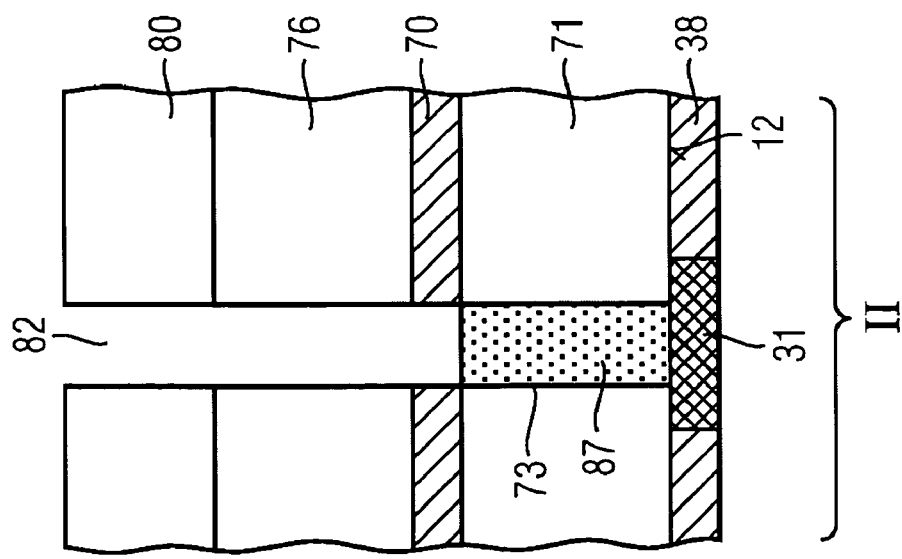
FIG 26

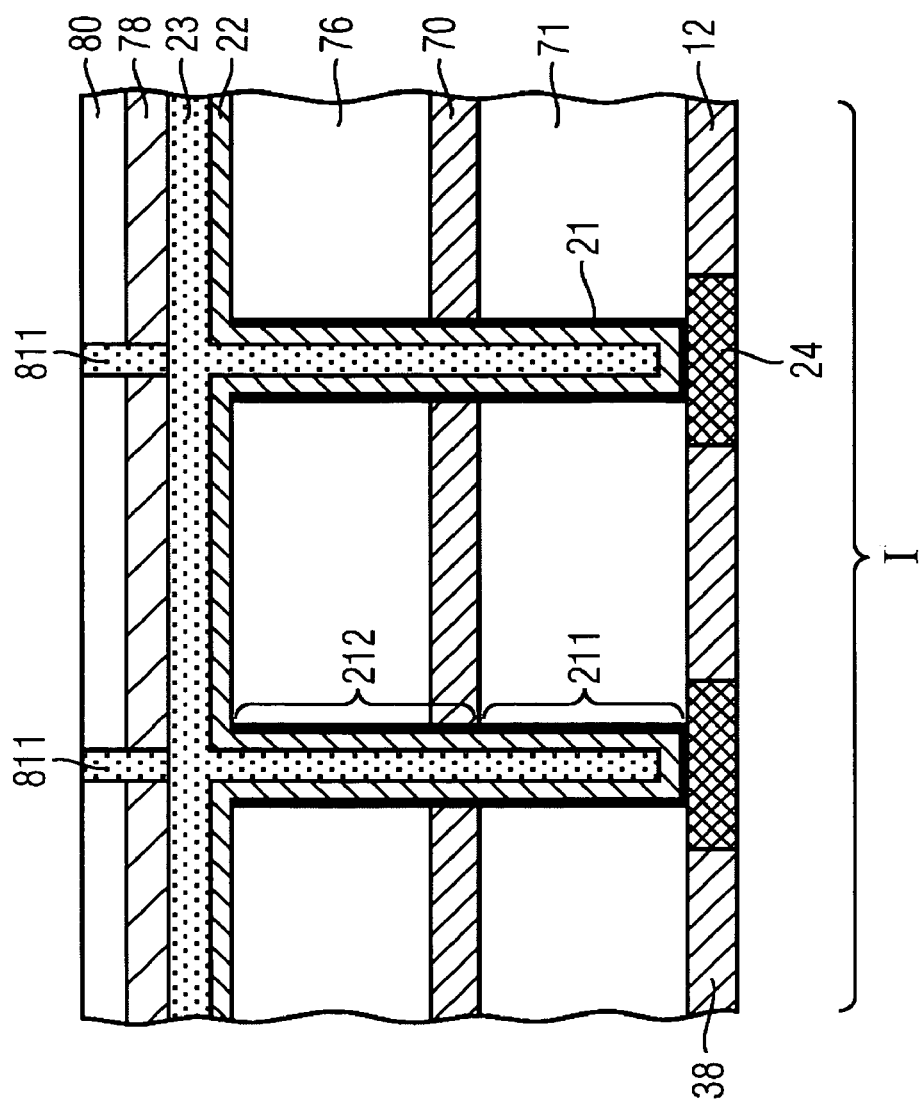
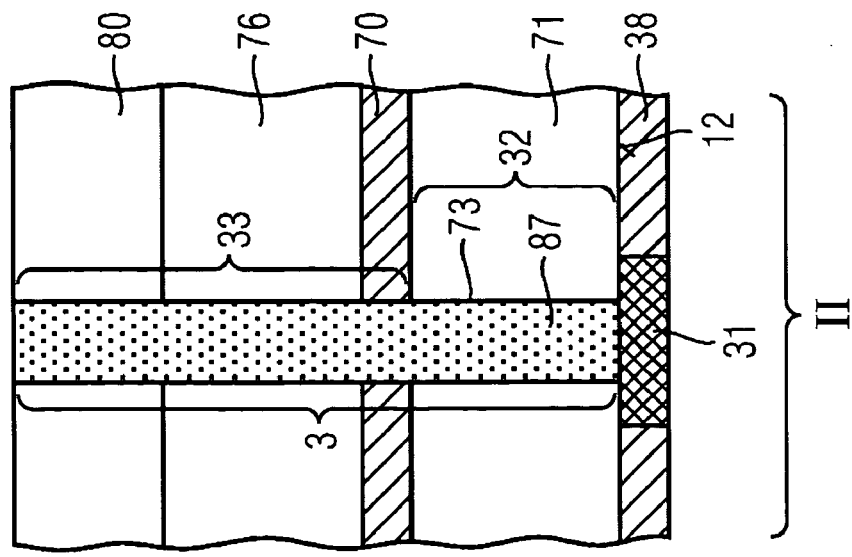
FIG 27

STORAGE CAPACITOR, A MEMORY DEVICE AND A METHOD OF MANUFACTURING THE SAME

BACKGROUND

Memory cells of a dynamic random access memory (DRAM) generally comprise a storage capacitor for storing an electrical charge which represents information to be stored, and an access transistor which is connected with the storage capacitor. The access transistor comprises a first and a second source/drain region, a channel connecting the first and second source/drain regions as well as a gate electrode controlling an electrical current flow between the first and second source/drain regions. The transistor usually is at least partially formed in a semiconductor substrate. The gate electrode forms part of a word line, and it is electrically isolated from the channel via a gate dielectric. By addressing the access transistor via the corresponding word line, the information stored in the storage capacitor is read out. In addition, by addressing the access transistor and transmitting an information signal via a bit line, data is stored in the corresponding memory cell, which is assigned to the specific word line and bit line.

According to an implementation of the DRAM memory cell, the electrical charge is stored in a stacked capacitor, which is formed above the surface of the substrate.

For future DRAM technologies, an increased cell capacitance for high performance and low power applications is desirable. For example, the cell capacitance can be increased by increasing the height of the stacked capacitor.

A memory device further comprises a support portion which is usually disposed at the edge of the memory cell array. Circuits such as: decoders, sense amplifiers and word line drivers for activating a word line are located in the support portion. Generally, the peripheral portion of a memory device includes circuitry for addressing memory cells and for sensing and processing the signals received from the individual memory cells.

Usually, the peripheral portion is formed in the same semiconductor substrate as the individual memory cells. Hence, a manufacturing process by which the components of the memory cell and the peripheral portion can be formed simultaneously is desirable.

SUMMARY

The present description relates to a storage capacitor, which can, for example, be used in a memory cell of a DRAM (Dynamic Random Access) memory. The description further relates to a memory device. In addition, the description refers to a method of manufacturing a storage capacitor as well as to a method of forming a memory device.

A storage capacitor, according to the present description, includes a first capacitor portion and a second capacitor portion, the second capacitor portion being disposed above the first capacitor portion, thereby defining a first direction. The first and the second portions each include a hollow body made of a conductive material, respectively, thereby forming a first capacitor electrode. An upper diameter of each of the hollow bodies is larger than a lower diameter of the hollow body, the diameter being measured perpendicularly with respect to the first direction. The storage capacitor also includes a second capacitor electrode and a dielectric material disposed between the first and the second capacitor electrodes. The storage capacitor also includes an insulating material disposed outside the hollow bodies, and a layer of an insulating material. A lower side of the insulating layer is disposed at a height of an upper side of the first capacitor portion.

The above and still further features and advantages of the device and method will become apparent upon consideration of the following definitions, descriptions and descriptive figures of specific embodiments thereof, wherein like reference numerals in the various figures are utilized to designate like components. While these descriptions go into specific details, it should be understood that variations may and do exist and would be apparent to those skilled in the art based on the descriptions herein.

BRIEF DESCRIPTION OF THE DRAWINGS

The device and method are explained in more detail below with reference to exemplary embodiments, where:

FIG. 1 shows a cross-sectional view of an exemplary embodiment;

FIG. 2A shows a cross-sectional view of the capacitor and the contact structure respectively according to one embodiment;

FIG. 2B shows a cross-sectional view of a capacitor and the contact structure, respectively, of a further embodiment;

FIG. 2C shows a cross-sectioned view of a capacitor and a contact structure according to yet another embodiment.

FIG. 3 shows a cross-sectional view of a substrate when starting a method of an embodiment;

FIGS. 4 to 12 show steps of the method of manufacturing the memory device according to an embodiment;

FIG. 14 shows a cross-sectional view of the substrate after a further processing step;

FIG. 15 shows a cross-sectional view of the substrate after providing a conductive material;

FIGS. 16 to 20 illustrate steps of the method according to another embodiment;

FIGS. 21 to 27 illustrate steps of a method according to another embodiment;

DETAILED DESCRIPTION

Figure 13:
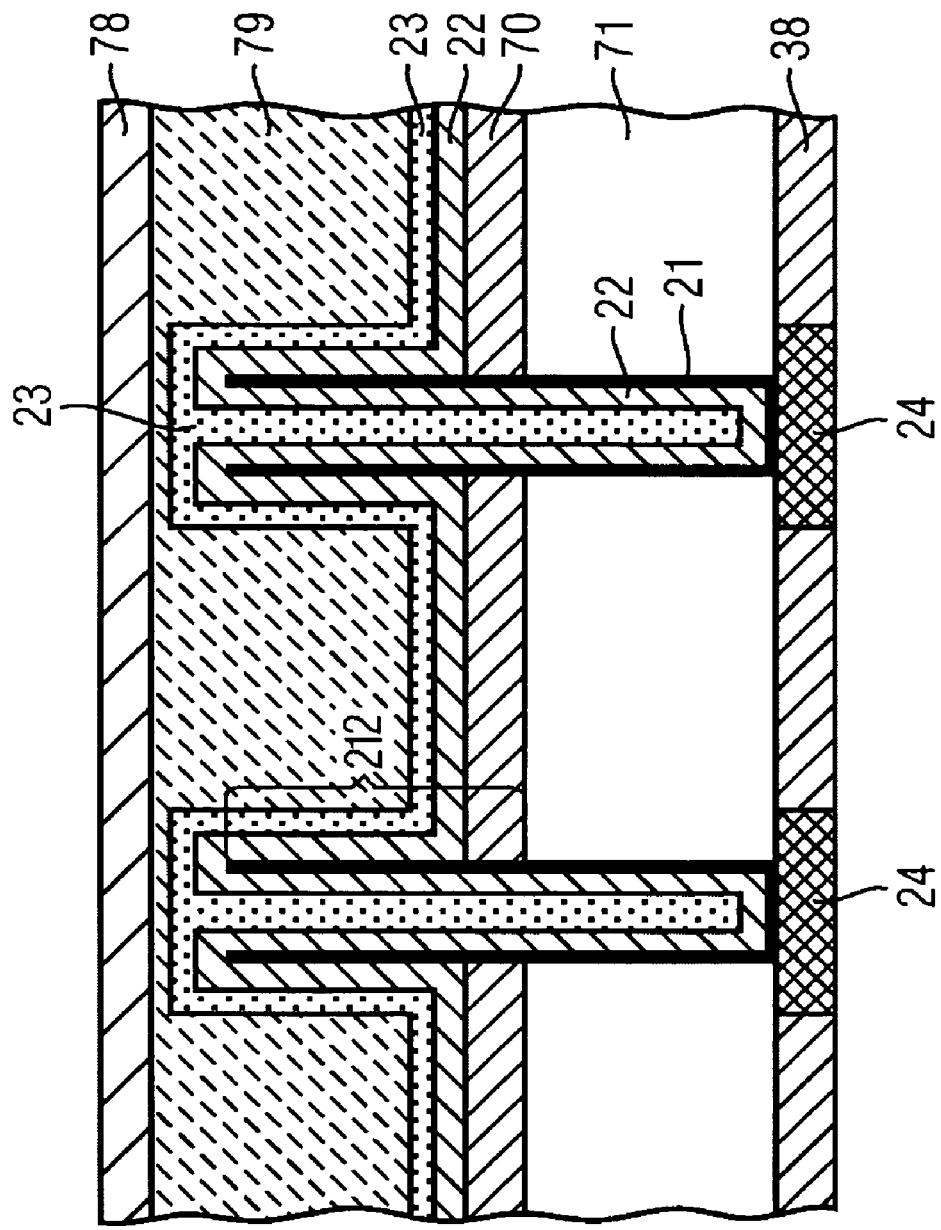
FIG. 13 shows a cross-sectional view of the storage capacitor according to a further embodiment.

As will be explained hereinafter, a storage capacitor comprises a first capacitor portion and a second capacitor portion. The second capacitor portion is disposed above the first capacitor portion. Thereby a first direction is defined. The first and the second portions each comprise a hollow body made of a conductive material, respectively. The combined hollow bodies form a first capacitor electrode. An upper diameter of each of the hollow bodies is larger than a lower diameter of the hollow body, wherein the diameter is measured perpendicularly with respect to the first direction. The storage capacitor further comprises a second capacitor electrode and a dielectric material disposed between the first and the second capacitor electrodes. The storage capacitor additionally comprises an insulating material disposed outside the hollow bodies and a layer of an insulating material. The lower side of the insulating layer is disposed at a height of an upper side of the first capacitor portion.

Likewise, a semiconductor memory device comprises a storage capacitor comprising a first capacitor portion and a second capacitor portion. The second capacitor portion is disposed above the first capacitor portion. Thereby, a first direction is defined. The first and the second portions each comprise a hollow body made of a conductive material, respectively. The combined hollow bodies form a first capacitor electrode. An upper diameter of each of the hollow bodies is larger than a lower diameter of the hollow body, wherein the diameter is measured perpendicularly with respect to the first direction. The storage capacitor further comprises a second capacitor electrode and a dielectric material disposed between the first and the second capacitor electrodes. The semiconductor device comprises an insulating material disposed outside the hollow bodies and an insulating layer of an insulating material. A lower side of the insulating layer is disposed at a height of an upper side of the first capacitor portion.

As will be also explained hereinafter, a method of manufacturing a storage capacitor includes providing a substrate having a surface. A first layer is provided on the surface of the substrate. The first layer is etched to define a first opening through the first layer. The first opening is filled with a sacrificial fill, and a second layer is provided over the first layer. The method also includes a second etch including etching the second layer to define a second opening through the second layer, wherein the first and second openings are in contact with each other. The sacrificial fill is at least partially removed. A first capacitor electrode is provided by providing a layer covering a surface of the first and second openings. A dielectric layer, covering the first capacitor electrode, is provided. A second capacitor electrode, covering the dielectric layer, is provided. The sacrificial fill includes a liner layer made of a conductive material and a dummy fill, wherein the dummy fill is removed prior to providing the first capacitor electrode, and the liner layer is maintained.

In the following paragraphs, exemplary embodiments of the storage capacitor, the semiconductor memory device and the methods of manufacturing the same are described in connection with the figures.

In the following detailed description reference is made to the accompanying drawings, which form a part hereof and in which is illustrated by way of illustration specific embodiments in which the device and method may be practiced. In this regard, directional terminology such as "top", "bottom", "front", "back", "leading", "trailing", etc., is used with reference to the orientation of the Figures being described. Since components of embodiments of the described device can be positioned in a number of different orientations, the directional terminology is used for purposes of illustration and in no way limiting. It is to be understood that other embodiments may be utilized and structural or logical changes may be made without departing from the scope of the described device and method. The following detailed description, therefore, is not to be taken in a limiting sense and the scope of the described device and method is defined by the appended claims.

FIG. 1 shows a cross-sectional view of a memory device according to an embodiment of the memory device. In particular, the right-hand portion of FIG. 1 illustrates the memory cell array portion I, whereas the left-hand portion of FIG. 1 illustrates the peripheral portion II of the memory device. As can be seen from the right-hand portion of FIG. 1, a plurality of memory cells are at least partially formed in a semiconductor substrate 1 having a surface 10. For example, each of the memory cells comprises an access transistor 5. The access transistor 5 is formed in the semiconductor substrate 1. The access transistor 5 comprises a first source/drain portion 51, a second source/drain portion 52 and a gate electrode 53. The gate electrode 53 is insulated from the semiconductor substrate 1 by the gate dielectric 57. The gate electrode 53 controls the conductivity of the channel 55 which is formed between the first and second source/drain regions 51, 52. In the shown embodiment, the word line isolator 531 is disposed above each of the gate electrodes 53, so that the gate electrodes 53 are completely buried, i.e., the surface of each of the gate electrodes 53 is disposed below the semiconductor substrate surface 10. In the shown embodiment, further, isolation structures 56 are provided so as to isolate adjacent memory cells from each other. The storage capacitors 2 of each of the memory cells are disposed above the semiconductor surface 10. Each of the storage capacitors 2 comprises a first capacitor electrode 21, a capacitor dielectric 22 and a second capacitor electrode 23. The capacitor dielectric 22 is disposed between the first and the second capacitor electrodes. The first and the second capacitor electrodes 21, 23 can, for example, be made of a conductive material such as a metal, a noble metal or a metal alloy. Examples of the conductive material comprise polysilicon, TiN, TaN, TaSiN, Ru, WN and HfN. The materials of the first and second capacitor electrodes 21, 23 can be identical or different from each other. The capacitor dielectric 22 can be made of any suitable dielectric material. Examples of the capacitor dielectric comprise a so-called high-k dielectric having a dielectric constant larger than 3.9. For example, $HfO_2$, HfSiO (hafniumsilicate), $ZrO_2$, $Al_2O_3$, HfAlO, TaO and any multilayer system comprising any of these layers may be selected.

As can further be seen, the first capacitor electrode 21 comprises a first capacitor portion 211 and a second capacitor portion 212. As is shown in FIG. 1, the second capacitor portion 212 is disposed above the first capacitor portion 211. The first capacitor electrode 21 is in contact with the capacitor contact 24. The capacitor contact 24 is in contact with the first source/drain portion of the access transistor 5 via the capacitor contact section 58. As can also be seen from FIG. 1, an insulating material is disposed outside the first and the second capacitor portions 211, 212. In particular, the insulating material may comprise a first insulating layer 71 and a second insulating layer 76. The first and the second insulating layers 71, 76 may be made of the same or different materials. Moreover, a separation layer 70 may be provided between the first and the second insulating layers 71, 76. For example, the separation layer 70 may be made of a material which is different from the first and second insulating materials. For example, if the first and the second insulating layers are made of silicon dioxide, the separation layer may be made of silicon nitride. As can be seen, the lower side of the separation layer 70 is disposed at the height of an upper side of the first capacitor portion 211.

The array portion may further comprise an insulating layer 54 which is disposed between the capacitor contacts 24 and the semiconductor substrate surface 10. The insulating layer 54 may be made of BPSG (boron phosphorous silicate glass). For example, further wiring layers (not shown in this drawing) may be disposed in this layer. For example, bit lines for reading/writing data stored in the stored capacitors may be disposed in this layer. In addition, the capacitor contacts 24 are insulated from each other via an insulating layer 38 which may be made, for example, of silicon nitride.

The left-hand portion of FIG. 1 shows the peripheral portion II. In particular, in the peripheral portion II, peripheral circuitry 37 for controlling a read and a write operation of the memory cell array may be provided. In addition, contact structures 83 are provided in the peripheral portion II. In particular, these contact structures 83 provide a connection between the peripheral circuitry 37 and wiring layers lying in a plane which is disposed at a height above an upper surface of the storage capacitor 22. As is illustrated in the left-hand portion of FIG. 1, each of the contact structures 3 may comprise a first contact structure portion 32 and a second contact structure portion 33. The second contact structure portion 33 is disposed above the first contact structure portion 32. The contact structure 3 is connected via the support contact pad 31 and the support contact section 35 to the peripheral circuitry 37. As is clearly to be understood, the support contact pad 31 may be a contact pad or a conductive line extending in an arbitrary direction. An insulating material 71, 76 is disposed outside the contact structure. For example, the insulating material may comprise a first insulating layer 71 and a second insulating layer 76 in the manner as described above with respect to the array portion. Moreover, the separation layer 70 may be disposed at a height so that the lower side of the separation layer is disposed at the height of the upper side of the first contact structure portion 32. The contact structure 3 may filled with a conductive material such as a suitable metal, for example, W, TiN, WN, TaN, Cu, Ta or any combination thereof.

In FIG. 1, the typical height of the contact structure 3 and of the storage capacitor 2 is approximately more than 2 µm, for example, more than 3 µm. Moreover, a typical diameter of the storage capacitor 2 may be 50 to 100 nm. A typical diameter of the contact structure 3 may be more than 50 nm, for example, more than 100 nm. An exemplary diameter of the contact structure 3 is between 50 to 150 nm. Furthermore, a typical aspect ratio of depth to diameter of the storage capacitors may be more than 10, for example more than 20 or more than 50, 80 or even more. A typical aspect ratio of the contact structures may be in the same range or may be less. In particular, as can be gathered from FIG. 1, the height of each of the contact structures 3 is approximately equal to the height of each of the storage capacitors 2.

FIG. 2A shows an enlarged cross-sectional view of the storage capacitor and the contact structure 3, respectively. As can be seen from the right-hand portion of FIG. 2A, in the array portion, the first and the second capacitor portion comprise a hollow body made of a conductive material, respectively. In particular, the first capacitor portion 211 is closed at the bottom portion and open in the upper portion. Moreover, the second capacitor portion 212 is open at the bottom portion and at the top portion thereof. The second capacitor portion 212 is disposed above the first capacitor portion 211, thereby defining a first direction. As can be seen, an upper diameter of each of the hollow bodies is larger than a lower diameter of the hollow body wherein the diameter is measured in a direction perpendicularly with respect to the first direction. Likewise, in the left-hand portion of FIG. 2A, the contact structure 3 comprises a first contact structure portion 32 and a second contact structure portion 33. The second contact structure portion 33 is disposed above the first contact structure portion 32. The first and the second contact structure portions are made of a conductive material and they are made as solid portions. Alternatively, voids may be formed in the first and the second contact structure portions. The diameter of the upper portion of the first contact structure portion is larger than a bottom diameter of the first contact structure portion. Moreover, an upper diameter of the second contact structure portion is larger than a bottom diameter of the second contact structure portion, wherein the diameter is measured in a direction perpendicular to the first direction.

As is clearly to be understood, embodiments of the described device also comprise the structure shown in FIG. 2C, wherein the diameter of the second capacitor portion decreases in the upper part thereof in a direction from first to second capacitor portion. Likewise, the diameter of the second contact structure portion may decrease in the upper part thereof in a direction from first to second capacitor portion.

According to a further embodiment, as is shown in FIG. 2B, the bottom portion of each of the first capacitor electrode and the contact structures are shifted in a direction which is perpendicular with respect to the first direction. In particular, the bottom portion of each of the first capacitor electrode 21 and the contact structures 3 may be shifted laterally with respect to the substrate surface compared to the top portion of the first capacitor electrode 21 and the contact structure 3. Accordingly, the center $P_1$ of the bottom portion of the first capacitor electrode 211 does not coincide with the center $P_2$ of the top portion 212 of the second capacitor portion 212. In addition, the center $D_1$ of the first contact structure portion 32 does not coincide with the center $D_2$ of the second contact structure portion 33.

Figure 29:
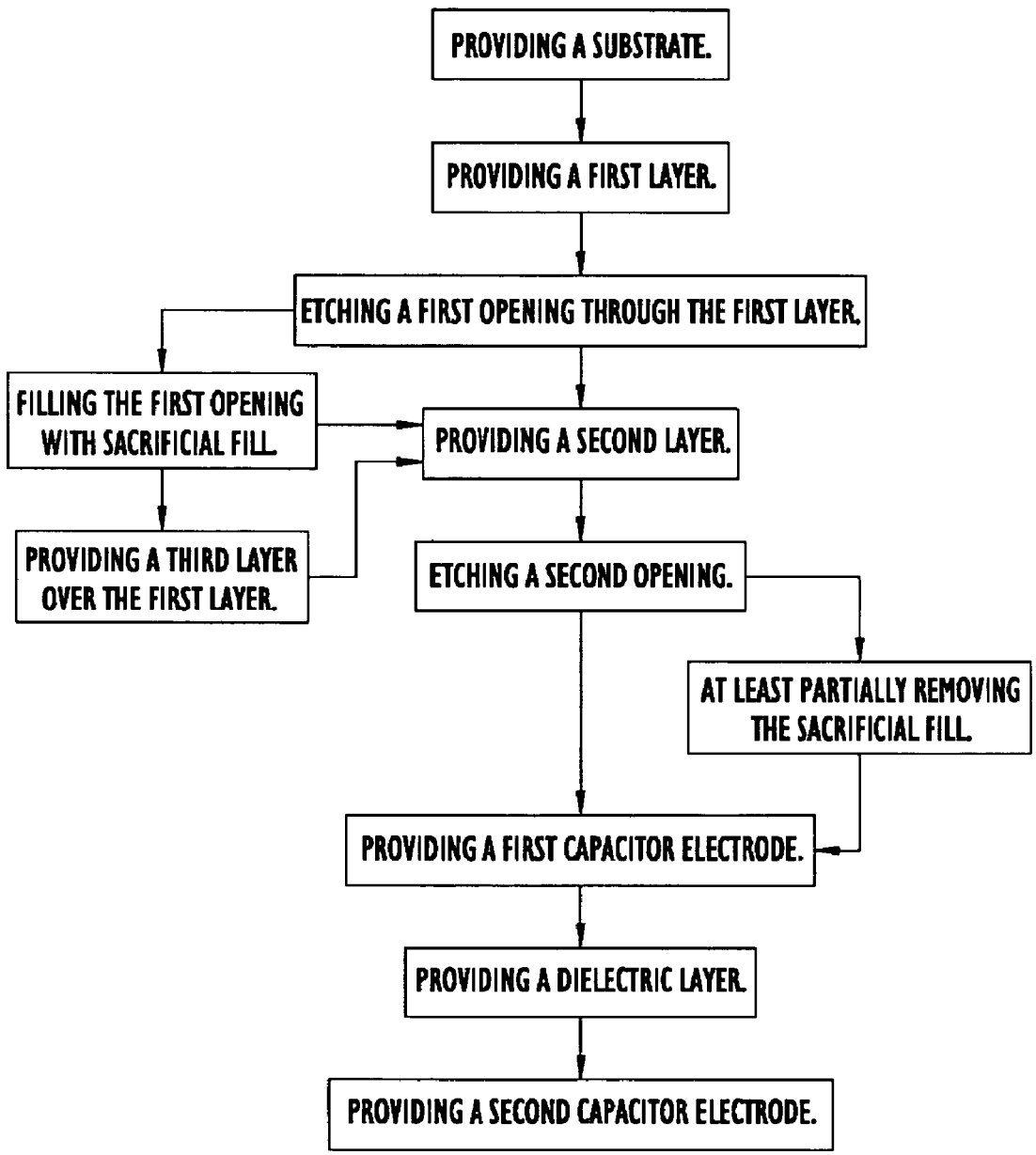
FIG. 29 shows a flowchart illustrating an embodiment of the described method.

In the following, embodiments of the method of forming a capacitor and the method of forming a memory device will be briefly explained with reference to FIGS. 29 and 30. As is shown in FIG. 29, for manufacturing a capacitor, first, a substrate having a surface is provided (S 10). For example, the substrate may be a layered substrate comprising a semiconductor substrate and one or more layers which are deposited on the surface of the semiconductor substrate. For example, capacitor contacts may be formed in the surface of the layered substrate. Subsequently, a first layer is deposited on the surface of the substrate (S 11). For example, the first layer may be made of a dielectric material such as silicon oxide or silicon nitride. Thereafter, an etching step is performed so as to define a first opening through the first layer (S 12). For example, this etching step may be a tapered etching step. Thereafter, a second layer is deposited over the first layer (S 13). The second layer may be of a material which is different from the material of the first layer or it may be made of the same material. Subsequently, a second etch is performed. In the second etch, the second layer is etched so as to define a second opening through the second layer, which is performed in such a manner so that the first and second openings are in contact with each other (S 14). Thereafter, a first capacitor electrode is provided by providing a layer which covers the surface of the first and second openings (S 15). Thereafter, a dielectric layer is provided, the dielectric layer covering the first capacitor electrode (S 16). Thereafter, a second capacitor electrode is provided which covers the dielectric layer (S 17).

According to an embodiment, the first opening may be filled with sacrificial fill prior to providing the second layer (S 18). This sacrificial fill is removed at least partially prior to providing the first capacitor electrode (S 19). For example, the sacrificial fill may comprise a liner layer made of a conductive material and a dummy fill, wherein the dummy fill is removed prior to providing the first capacitor electrode, the liner layer being maintained.

According to a further embodiment, a third layer may be provided over the first layer prior to providing a second layer (S 20), wherein the material of the third layer is different from the materials of the first and second layers and wherein a second etch comprises etching the third layer. Also, according to an embodiment, the third layer may be provided after filling the first opening with a sacrificial fill (S 18).

Figure 30:
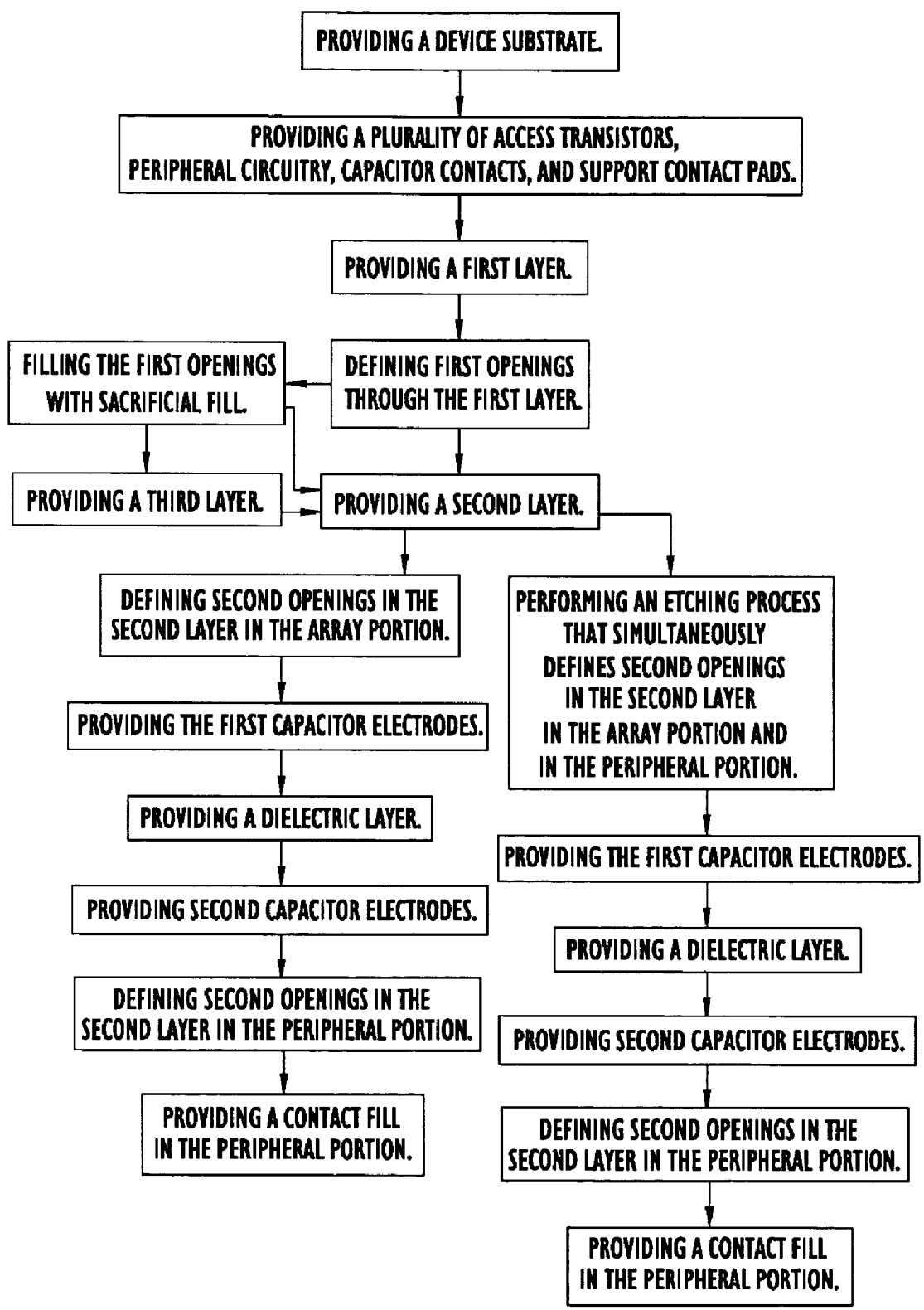
FIG. 30 shows a flowchart illustrating another embodiment of the described method.

As is illustrated in FIG. 30, an embodiment of forming a memory device comprises providing a device substrate having a surface, the device substrate including a semiconductor substrate (S 10). In particular, this device substrate may comprise a semiconductor substrate with one or more insulating or dielectric layers deposited on the surface thereof. A plurality of access transistors are provided in the array portion, wherein each of the access transistors is at least partially formed in the semiconductor substrate (S 30). Moreover, peripheral circuitry is provided in the peripheral portion, wherein the peripheral portion is at least partially formed in the semiconductor substrate (S 40). In addition, capacitor contacts are provided in the array portion adjacent to the device substrate surface (S 31). In the peripheral portion support contact pads are provided adjacent to the device substrate surface (S 41). For example, these steps may be performed simultaneously or in arbitrary succession. Thereafter, a first layer is provided on the surface of the device substrate (S 11). The first layer is etched so as to define first openings through the first layer, wherein part of the first openings are in contact with the capacitor contacts and part of the first openings are in contact with the support contact pads (S 12). In a later process step, a second layer is provided over the first layer (S 13). Second openings are defined in the second layer in the array portion, wherein the second openings are in contact with the first openings (S 32). Moreover, second openings are defined in the second layer in the peripheral portion, the second openings being in contact with the first openings (S 42). For example, these steps of defining the second openings may be performed simultaneously by one common etching step or they may be performed in an arbitrary succession. The first capacitor electrodes are provided by providing a layer covering a surface of the first and second openings in the array portion (S 15). Moreover, a dielectric layer is provided, the dielectric layer covering the first capacitor electrodes in the array portion (S 16). Then, second capacitor electrodes are provided, the second capacitor electrodes covering the dielectric layer (S 17). In addition, a contact fill is provided in the peripheral portion, whereby support contacts are provided (S 43).

According to an embodiment, the first openings may be filled with sacrificial fill prior to providing the second layer (S 18). Moreover, the method may further comprise providing a third layer over the first layer prior to providing a second layer (S 20), wherein the material of the third layer is different from the materials of the first and second layers and wherein the second etch comprises etching the third layer. For example, the third layer may be provided after filling the first openings with a sacrificial fill (S 18).

In the following, the method of manufacturing a memory device as shown in FIGS. 1 and 2, respectively, will be explained in more detail. Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

For starting the method of manufacturing a memory device, first, a semiconductor substrate 1, such as a silicon substrate, for example, a p-doped silicon substrate 1 is provided. As is shown in FIG. 3, an array circuitry 59 such as the one shown in FIG. 1 is provided. Nevertheless, as is obvious to the person skilled in the art, any other array circuitry which is adapted to implement the functions of a read and a write operation may be provided. Moreover, several contact structures and insulating layers may be provided on top of the semiconductor substrate 1. The capacitor contacts 24 are provided so as to provide an electrical contact between the first capacitor electrode (not shown in this drawing) and the array circuitry 59. For example, additional capacitor contact sections 58 may be provided, for connecting the capacitor contacts 24 to the array circuitry 59. Moreover, the capacitor contacts may be insulated from each other via an insulating layer 38 such as a silicon nitride layer. A boron phosphorus glass (BPSG) layer 54 may be disposed between the semiconductor substrate 1 and the silicon nitride layer 38. Further, an additional silicon nitride layer 72 may be disposed on top of the silicon nitride layer 38. For example, this additional silicon nitride layer 72 may act as an etch stopping layer.

In the following, the surface 12 of this layered substrate is defined as the substrate surface on which the processing steps are to be performed. In a similar manner, in the peripheral portion II, the peripheral circuitry 37 may be formed in the semiconductor substrate 1. On top of the semiconductor substrate surface 10, the BPSG layer 54 may be disposed. Support contact pads (31) are formed above the surface of the BPSG layer 54 and insulated from each other by the silicon nitride layer 38. As is clearly to be understood, the support contact pads (31) may be implemented as local pads or they may be implemented as lines which extend in an arbitrary direction. The support contact pads (31) are connected to the peripheral circuitry via support contact sections 35. On top of the silicon nitride layer 38, a further silicon nitride layer 72 may be disposed.

For implementing the described method, first, an insulating layer, such as a silicon oxide layer 71 is deposited by a generally known method. For example, the silicon oxide layer 71 may be deposited by a PECVD (plasma enhanced chemical vapor deposition) method using, for example, silan oxide as a starting material. The silicon oxide layer may have a thickness of approximately more than 750 nm or more than 1 µm, for example, more than 1.5 µm or more than 2 µm. The resulting structure is shown in FIG. 3.

As can be seen from FIG. 3, now the first silicon oxide layer 71 is disposed on the surface 12 of the layered substrate 11. Thereafter, as can be seen from FIG. 4 first capacitor openings 74 are defined in the array portion whereas first contact openings 73 are defined in the peripheral portion. For example, the openings may be defined photolithographically by optionally applying a hardmask material followed by a suitable photoresist material on the surface of the silicon oxide layer 71. Openings are defined in the photoresist material using a photomask. After a corresponding developing process, openings are defined in the photo resist material; the remaining portions of the photo resist material act as a mask during a subsequent etching step. For example, etching of the silicon oxide layer 71 may be accomplished by dry etching, such as RIE (reactive ion etching). As a result, as is shown in FIG. 4, first capacitor openings 74 are formed in the silicon oxide layer 71, the first capacitor openings 74 being in contact with the capacitor contacts 24. Moreover, in the peripheral portion, first contact openings 73 are formed, the first contact openings 73 being in contact with the support contact pads 31. For example, this etching may be performed as a tapered etching, such that, as a result, the upper diameter of the first capacitor openings 74 and the first contact openings 73 is larger than the bottom diameter thereof.

Thereafter, the etched openings 74, 73 may be filled with a sacrificial material 75. The sacrificial material may be selected from any chemical compound which may be easily removed after the next processing steps. In particular, the sacrificial material 75 should be a material that withstands temperatures higher than, for example, 400° C. which will prevail when depositing the insulating material to follow. Examples of the material of the sacrificial fill comprise polysilicon, SiGe or an organic polymeric material that withstands temperatures around 450° C. The sacrificial fill may as well comprise conductive materials, such as metals. For example, the sacrificial fill may comprise a liner layer 751 and a conductive filling 75 which may be used for forming the contact structures in the peripheral portion. By way of example, the liner 751 may be selected from TiN or WN, followed by a metal filling such as tungsten. After providing the sacrificial fill 75, a CMP (chemical mechanical polishing) step is performed, so as to obtain a smooth surface. The resulting structure is shown in FIG. 5.

As can be seen, now, the first capacitor opening 74 is filled with a suitable liner 751 and a sacrificial filling 75. Moreover, in the peripheral portion, the same materials are provided. As is shown, the first contact opening 73 is filled with a liner 751 and a sacrificial filling 75.

In the next step, optionally, a separation layer 70 may be provided. For example, the separation layer 70 may be made of silicon nitride. Nevertheless, any other material may be selected. Nevertheless, it is advantageous to select a material which is different from the material of the silicon oxide layer 71 and which may be etched selectively with respect to this layer. Thereafter, a second silicon oxide layer 76 is deposited on the surface of the silicon nitride layer 70. For example, the second silicon dioxide layer 76 may have a thickness of more than 500 nm, for example, more than 750 nm, or 1 μm, for example more than 1.5 μm or even more. In addition, the second silicon dioxide layer 76 may be deposited in the same manner as has been described above. The resulting structure is shown in FIG. 6. As can be seen, on top of the first silicon oxide layer 71, the silicon nitride layer 70 is deposited, followed by the second silicon oxide layer 76. It lies clearly within the scope of the described method that the second layer 76 is made of a material different from the material of the first layer 71.

During the next steps the peripheral portion will be covered by a photo resist layer so that the processing steps to follow are only performed in the array portion. This may be accomplished by providing a photoresist layer and patterning the photoresist layer using a suitable photomask. For example, the photomask may have a pattern so that the exposed and developed photoresist material covers the peripheral portion. Moreover, in the array portion second capacitor openings 77 are defined. Then, the second capacitor openings 77 are formed in the silicon nitride layer 70 and a second silicon oxide layer 76. For example, this etching may comprise a first selective etching step which etches silicon oxide selectively with respect to silicon nitride, followed by a second etching step of etching silicon nitride material. For example, dry etching steps such as reactive ion etching can be used for etching the second capacitor opening 77.

This etching may be performed by using a hardmask as has been explained above. For example, this etching may also be a tapered etching. As a result, an upper diameter of the second capacitor openings may be larger than the bottom diameter of the second capacitor openings 77. The second capacitor opening 77 are formed so as to be in contact with the first capacitor openings 74. Nevertheless, the position of the first capacitor openings 74 may be laterally shifted with respect to the second capacitor opening 77. In case the silicon nitride layer 70 is omitted, the etching may be a time controlled etching step so as to stop on the upper portion of the first capacitor opening 74. Subsequently, the remaining portions of the photoresist layer are removed. The resulting structure is shown in FIG. 7 showing the second capacitor opening 77. The sacrificial fill 75 is removed from the combined first and second capacitor openings. For example, in case the sacrificial fill comprises a liner layer and a metal fill, the metal fill may be completely removed from the first capacitor opening 74 such that the liner layer 751 remains in the first capacitor opening 74. The resulting structure is shown in FIG. 8. As can be seen in FIG. 8, a liner layer 751 is present in the first capacitor opening 74, whereas the surface of the second capacitor opening 77 is exposed.

Thereafter, the material for the first capacitor electrode 21 is deposited. For example, TiN, TaN, TaSiN, Ru or WN may be selected as the material of the first capacitor electrode. In particular, in case a liner layer 751 already covers the surfaces of the first capacitor opening 74, the first capacitor electrode 21 will have a larger thickness in the first capacitor portion 211. Thereby, the resistance of the first capacitor electrode is reduced. The first capacitor electrode further comprises a second capacitor portion 212 which is disposed above the first capacitor portion 211. The resulting structure is shown in FIG. 9.

Thereafter, the conductive material of the first capacitor electrode may be removed from the surface 761 of the second silicon oxide layer 76. For example, this may be accomplished by a special reactive ion etching process by which only those horizontal portions of the metal layer which are disposed on top of the second layer 76. Alternatively, the capacitor openings 74 and 77 may be filled with a sacrificial material, followed by a CMP step so as to remove the horizontal portions of the metal layer constituting the first capacitor electrode. Thereafter, the sacrificial material will be removed from the first and second capacitor openings 74, 77.

The resulting structure is shown in FIG. 10. As can be seen, the first capacitor electrode 21 now covers the surface of the first and second capacitor openings, leaving the horizontal surface 761 of the second silicon oxide layer 76 uncovered.

Thereafter, a dielectric material may be deposited by generally known methods. As has been mentioned above, hafnium oxide, hafnium silicate (HfSiO) zirconium oxide, aluminum oxide, hafnium aluminum oxide and any multi-layer system comprising any of these materials may be selected as the capacitor dielectric. As a result, as is shown in FIG. 11, the capacitor dielectric 22 is disposed on the horizontal surface 761 of the second silicon oxide layer as well as on the first capacitor electrode 21.

Thereafter, the material for the second capacitor electrode 23 is deposited. For example, this may be accomplished, by first depositing a liner layer, for example of TiN, and a conductive material such as Tungsten. Thereafter, for example, a silicon nitride cap layer 78 is deposited. The resulting structure is shown in FIG. 12. As can be seen, now, the surface 761 of the second silicon oxide layer 76 is covered with the capacitor dielectric 22, the second capacitor electrode 23 and the silicon nitride layer 78. Moreover, the first and the second capacitor openings 74, 77 are filled with the material of the second capacitor electrode 23. In addition, as can be seen in the left-hand portion of FIG. 12, in the peripheral portion, now, the dielectric layer 22, the material forming the second capacitor electrode 23 and the silicon nitride layer 78 are disposed on top of the second silicon oxide layer 76.

FIG. 13 shows an alternative embodiment of the array portion in a case in which the second silicon oxide layer 76 is removed after the step illustrated with reference to FIG. 10. To be more specific, starting from the structure shown in FIG. 10, first, a silicon oxide etching step is performed so as to remove the second silicon oxide layer 76. As a result the first capacitor electrode 21 will protrude from the resulting surface of the structure. Thereafter, the capacitor dielectric 22 is deposited, followed by a step of depositing the second capacitor electrode 23. As a result, the first and second capacitor openings 74, 77 will be filled with a material constituting the second capacitor electrode. Moreover, the horizontal portions of the second capacitor electrode 23 and the capacitor dielectric 22 are directly adjacent to the silicon nitride layer 70. Thereafter, a silicon oxide layer 79 is deposited followed by a CMP step so as to obtain a smooth surface. Subsequently, the silicon nitride layer 78 is deposited. The resulting structure is shown in FIG. 13.

As can be taken from FIG. 13 the capacitor capacitance is increased due to the increased surface area of the capacitor electrodes 21, 23. As is shown in FIG. 13, the capacitor dielectric 22 is adjacent to the inner surface of the first capacitor electrode 21. Moreover, the capacitor dielectric 22 is adjacent to the outer surface of the upper portion of the first capacitor electrode. In addition, in the second capacitor portion 212, the second capacitor electrode 23 extends along the outer surface of the first capacitor electrode 21. A horizontal portion of the second capacitor electrode 23 and the capacitor dielectric 22 is disposed below the surface of the silicon oxide layer 79.

Thereafter, the support contact 3 will be completed in the peripheral portion, and a plate contact 811 will be provided in the array portion. To this end, first, part of the layer stack present in the peripheral portion II will be removed. To be more specific, the capacitor dielectric 22, the second capacitor electrode 23 and the silicon nitride layer 78 are removed from the peripheral portion. Thereafter, a further silicon oxide layer 80 is deposited, followed by a CMP step so as to obtain a smooth surface. Then, a further lithographic step will be performed so as to define openings 81 in the array portion and openings 82 in the peripheral portion. In particular, the openings 81 in the array portion will provide the plate contacts 811. For example, etching the second contact openings may be performed in such a manner such that an upper diameter of the second contact openings 82 is larger than the bottom diameter of the second contact opening. In addition the second contact opening may be laterally shifted with respect to the first contact opening 73. For example, this etching step may stop on the silicon nitride layer 78. Thereafter, the selective etching step for etching silicon nitride may be performed so that the openings 81 are in contact with the second capacitor electrode 23 and the second contact opening 82 is in contact with the first contact opening in the peripheral portion. The resulting structure is shown in FIG. 14.

Thereafter, a contact fill 87 comprising a conductive material may be provided so as to fill the plate contact opening 81 and the second contact opening 82. For example, a suitable liner layer such as a TiN liner may be deposited followed by a tungsten filling. Thereafter, a CMP step will be performed so as to obtain a smooth surface. The resulting structure is shown in FIG. 15. As can be seen, plate contacts 811 are provided in the array portion whereas contact structures 3 are completed in the peripheral portion II. For example, each of the support contacts 3 may comprise a first contact structure portion 32 and a second contact structure portion 33, the second contact structure portion 33 being disposed above the first contact structure portion 32. In the completed memory device, the plate contacts 811 are used for holding the second capacitor electrode 23 at a predetermined potential.

According to a further embodiment of the present invention, the second capacitor openings 77 are formed simultaneously with the second contact opening 82 in the peripheral portion. To this end, starting from the structure shown in FIG. 6, a photolithographic step is performed so as to expose a photoresist material using a mask having openings in the array portion as well as in the peripheral portion. Accordingly, second capacitor openings 77 are defined in the photoresist material and, at the same time, second contact openings 82 are defined in the photo resist material in the peripheral portion II. Thereafter, an etching step which is similar to the etching steps described with reference to FIG. 7 is performed. In particular, the etching may comprise a first selective etching step for etching silicon oxide and a second selective etching step for etching silicon nitride material. The resulting structure is shown in FIG. 16.

As is shown in FIG. 16, now, the second capacitor openings 77 are in contact with the first capacitor openings 74, and, in the peripheral portion, the second contact openings 82 are in contact with the first contact openings 73. Thereafter, the sacrificial filling is removed from the peripheral portion and the array portion. To be more specific, in case the sacrificial fill 75 comprises a liner layer 751 and an appropriate filling, also only the appropriate filling material may be removed, leaving the liner layer on the sidewalls of the first capacitor opening 74 and the first contact opening 73. Thereafter, the first capacitor electrode material is deposited. Subsequently, the material of the first capacitor electrode 21 is removed from the horizontal surface 761 of the second silicon oxide layer 76 in the array portion I and in the peripheral portion II. For example, this may accomplished in the manner as has been described above with respect to FIG. 9. After removing the first capacitor electrode 21 from the horizontal surface 761, a dielectric material 22 is deposited. As a result, the structure shown in FIG. 17 is obtained. As can be seen, now, the material of the first capacitor electrode is present in the array portion I as well as in the peripheral portion II. Moreover, the dielectric layer 85 is present in the peripheral portion as well as in the array portion.

In the next step, the array portion is covered with a suitable resist layer 86. Examples of the resist layer 86 include materials such as a photoresist material. Thereafter, a photolithographic step is performed so as to cover the array portion with a block mask, leaving the peripheral portion exposed. Subsequently, an etching step is performed so as to remove the dielectric material 85 from the peripheral portion. As a result, the structure shown in FIG. 18 is obtained. As can be seen from FIG. 18, the array portion I is covered with a resist layer 86, whereas in the peripheral portion II only the material constituting the first capacitor electrode in the array portion, for example, a TiN layer 84 is present.

Subsequently, the resist material 86 is removed from the array portion and the material forming the second capacitor electrode is deposited. By way of example, this may be accomplished by depositing a TiN liner, followed by a tungsten filling. A further lithographic step is performed so as to remove the upper portion of the tungsten filling 23 from the peripheral portion. As a result, the structure shown in FIG. 19 is obtained. As can be seen from FIG. 19, now the entire surface of the array portion I is covered with the tungsten layer constituting the second capacitor electrode. Moreover, in the peripheral portion II, the support contact 3 now comprises a contact fill 87, the contact fill being in contact with the TiN layer 84 and the support contact pad 31.

Thereafter, the structure is completed by depositing a further silicon oxide layer 80. A CMP step is performed so as to obtain a smooth surface. Then, a photolithographic step is performed so as to obtain openings in the peripheral portion, the openings being in contact with the contact fill 87 shown in FIG. 19. Moreover, openings are formed in the array portion so as to contact the second capacitor electrode 23. A conductive material is provided in these openings. For example, a liner layer may be deposited, followed by a tungsten filling and a CMP step.

As a result, the structure shown in FIG. 20 is obtained. As can be seen, in the array portion, plate contacts 811 made of a conductive material are provided, the plate contacts 811 being in contact with the second capacitor electrode. Moreover, in the peripheral portion, the support contacts 3 are completed by providing contact plugs 83 which are in contact with the contact fill 87.

According to still a further embodiment, starting from the structure shown in FIG. 5, the array portion is covered with a photoresist material. For example, this may be accomplished by applying a photoresist material and performing a photolithographic step using a block mask. As a result, the array portion is covered with a photo resist material leaving the peripheral portion uncovered. In the peripheral portion, the sacrificial filling 75 filling the contact openings 73 is removed and replaced with a contact fill 87. The resulting structure is shown in FIG. 21.

As can be seen, now, in the array portion I a sacrificial filling 75 is present. Optionally, the liner 751 may be provided on the surface of the first capacitor opening 74. In the peripheral portion II, a contact fill 87 is provided in the first contact opening 73. Thereafter, a separation layer such as made of silicon nitride 70 may be provided, followed by a second silicon oxide layer 76. For example, the separation layer 70 may have a thickness of 50 to 100 nm, whereas the second silicon oxide layer 76 may have a thickness of at least 800 nm, preferably more than 1 µm or even more. The resulting structure is shown in FIG. 22. The structure shown in FIG. 22 is quite similar to the structure shown in FIG. 6 with the sacrificial filling in the peripheral portion being replaced with the conductive filling 87.

Figure 23:
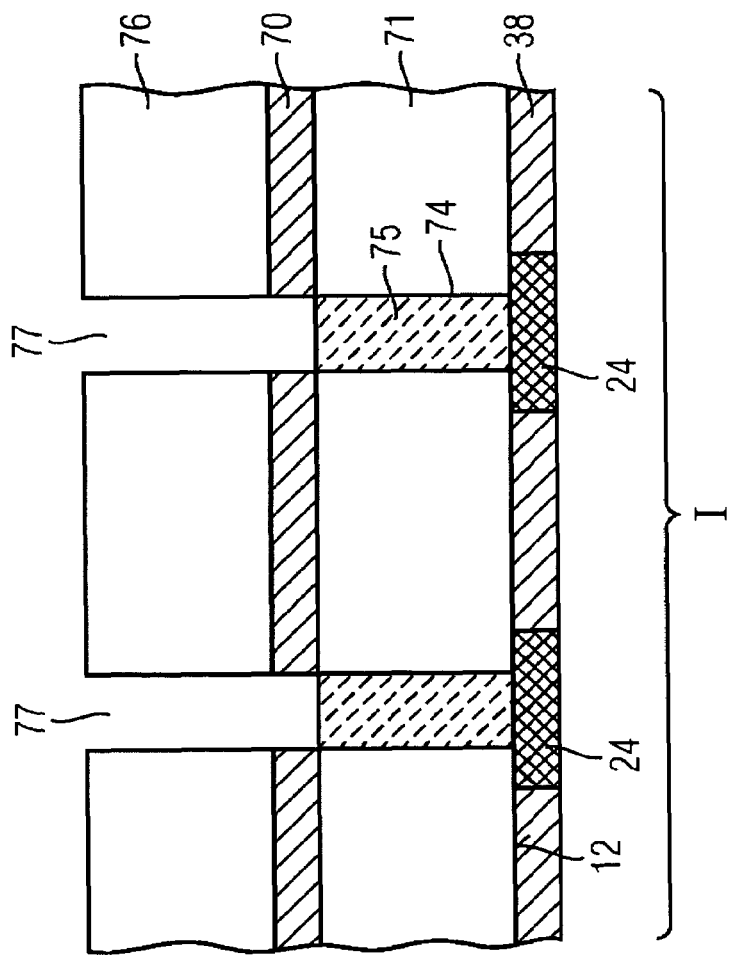
Figure 24:
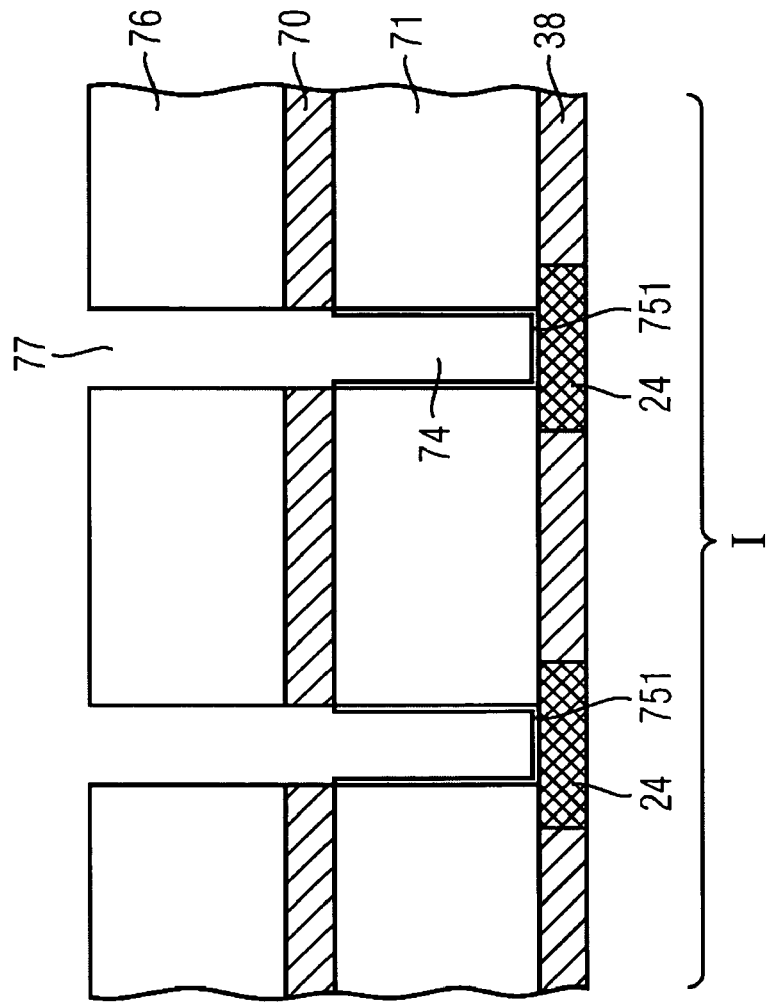

Thereafter, second capacitor openings 77 will be provided in the array portion, while leaving the peripheral portion unchanged. Accordingly, this may be accomplished by using a suitable photo mask for exposing a photo resist material (not shown). After defining the openings 77 in the photo resist material, an etching step is performed so as to etch the second capacitor openings 77. For example, this etching may be similar to the etching step described with reference to FIG. 7. The resulting structure is shown in FIG. 23. As can be seen in FIG. 23, in the array portion I, second capacitor openings 77 are formed so as to be in contact with the first capacitor openings 74. The peripheral portion remains unchanged. Therefore an illustration thereof is omitted for the sake of simplicity. Thereafter, the sacrificial material is removed from the array portion. For example, in case the sacrificial filling comprises also a liner layer 751 which is directly in contact with the first capacitor opening, this sacrificial liner will remain as is shown in FIG. 24. As is shown in FIG. 24, the surface of the first capacitor opening 74 is covered with the liner layer 751.

Thereafter, the material forming the first capacitor electrode is deposited. For example, in case a liner layer 751 covers the first capacitor opening 74 now a first capacitor portion 211 has a greater thickness than the second capacitor portion 212. The resulting structure is shown in FIG. 25.

Thereafter, the portions of the first capacitor electrode 21 covering the horizontal surface 761 of the second silicon oxide layer 76 will be removed in a similar manner as has been described above with reference to FIG. 10. Thereafter, the materials forming the dielectric layer 22 and the second capacitor electrode 23 will be provided in a similar manner as has been described above. Subsequently, a silicon nitride layer 78 is deposited in the same manner as has been described above. Thereafter, a block mask is provided on the array portion, leaving the peripheral portion uncovered. The silicon nitride layer 78, the material of the second capacitor electrode 23 and the material of the capacitor dielectric 22 will be removed from the peripheral portion. Next, a silicon oxide layer 80 is provided on the resulting surface. Thereafter, the steps which have been described above with reference to FIG. 14 will be performed so as to define the plate contact openings 81 and the second contact openings 82. For example, a lithographic process is performed so as to define plate contact openings 81 in the array portion and second contact openings 82 in the peripheral portion.

The resulting structure is shown in FIG. 26. As can be seen, in the array portion I plate contact openings 81 are provided so as to be in contact with the second capacitor electrode 23. Moreover, in the peripheral portion II, second contact openings 82 are provided so as to be in contact with the contact fill 87 which is filled in the first contact opening 73. Thereafter, a conductive material will be provided in the plate contact openings 81 and the second contact openings 82. For example, this may be accomplished by first providing a liner layer such as a TiN liner, followed by a step of depositing a tungsten filling. Subsequently, a CMP step will be performed so as to obtain a smooth surface. As a result, the structure shown in FIG. 27 is obtained. As can be seen, in the array portion, now, plate contacts 811 are provided so as to be in contact with the second capacitor electrode 23. Moreover, in the peripheral portion, the support contacts 3 are completed, each of the support contacts comprising a first contact structure portion 32 and a second contact structure portion 33.

Figure 28:
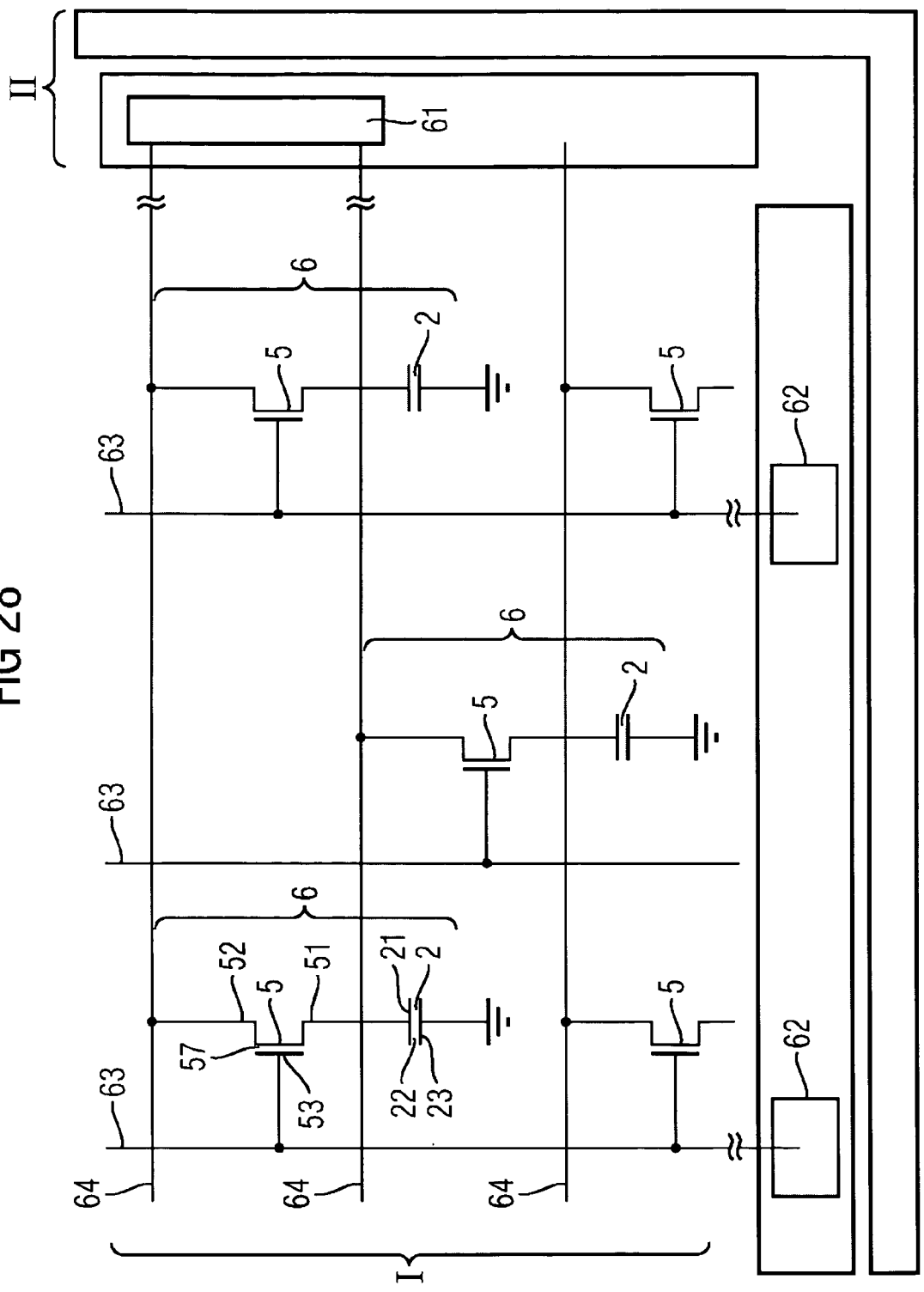
FIG. 28 shows an exemplary plan view of a memory device according to an embodiment.

FIG. 28 shows an exemplary plan view of a memory device, comprising a memory cell array I and a peripheral portion II. The memory cell array I comprises a plurality of memory cells 6, each of the memory cells comprising a storage capacitor 2 and an access transistor 5. The storage capacitor comprises a first and a second capacitor electrode 21, 23, the first capacitor electrode 21 being connected with a first source/drain region 51 of the access transistor 5. A channel is formed between the first and second source/drain regions 51, 52, and a gate electrode 53 controls the conductivity of the channel. The gate electrode 53 is insulated from the channel by a gate insulating layer 57. By addressing the access transistor 5 via a corresponding word line 63, the information stored in the storage capacitor 2 is read out to a corresponding bitline 64. The layout shown in FIG. 28 corresponds to the so called folded bitline layout. However, as is to be clearly understood, the described device is applicable to any kind of memory cell array layout.

The support portion II refers to a portion at the edge of the memory cell array in which support circuits such as decoders, sense amplifiers 61 and word line drivers 62 for activating a word line are located. Generally, the peripheral portion of a memory device includes circuitry for addressing memory cells and for sensing and processing the signals received from the individual memory cells.

While the device and method have been described in detail with reference to specific embodiments thereof, it will be apparent to one of ordinary skill in the art that various changes and modifications can be made therein without departing from the spirit and scope thereof. Accordingly, it is intended that the described device and method cover the modifications and variations of this device and method provided they come within the scope of the appended claims and their equivalents.

What is claimed is:

1. A method of manufacturing an integrated circuit comprising a storage capacitor, the method comprising:

forming a first layer over a surface of a substrate;

defining a first opening in the first layer;

filling the first opening with a sacrificial filling, the sacrificial filling comprising a sacrificial material;

forming a second layer over the first layer;

defining a second opening in the second layer to expose at least a portion of the sacrificial filling;

completely removing the sacrificial material;

forming a layer covering a surface of the first and second openings thereby providing a first capacitor electrode;
forming a dielectric layer covering the first capacitor electrode; and
forming a second capacitor electrode covering the dielectric layer.

2. The method according to claim 1, wherein the sacrificial material comprises a material selected from the group including: SiGe, polysilicon and an organic polymeric compound.

3. The method according to claim 1, further comprising:
a polishing step subsequent to filling the first opening and prior to providing the second layer.

4. The method of claim 1, wherein the sacrificial filling further comprises a sacrificial liner layer in contact with the first opening, wherein removing the sacrificial material does not remove the sacrificial liner.

5. The method of claim 4, wherein the liner layer comprises a material selected from the group consisting of W, TiN, and WN.

6. The method of claim 4, wherein, after removing the sacrificial material, the horizontal portions of the sacrificial liner remain.

7. The method according to claim 1, wherein the sacrificial material is removed in a step that is different from the step defining the second opening.

8. A method of manufacturing an integrated circuit comprising a storage capacitor, the method comprising:
forming a first layer over a surface of a substrate;
defining a first opening in the first layer;
thereafter, forming a third layer over the first layer;
forming a second layer over the third layer;
defining a second opening in the second and third layers;
forming a layer covering a surface of the first and second openings thereby providing a first capacitor electrode;
forming a dielectric layer covering the first capacitor electrode; and
forming a second capacitor electrode covering the dielectric layer, wherein the material of the third layer is different from the materials of the first and second layers.

9. The method according to claim 8, wherein forming the third layer is performed subsequent to filling the first opening with a sacrificial filling.

10. The method according to claim 8, wherein forming the first capacitor electrode comprises:
depositing a layer of conductive material over the exposed surface of the first and second layers; and
removing the layer of the conductive material from a top surface of the second layer.

11. The method according to claim 8, wherein forming the second capacitor electrode comprises depositing a conductive material over the dielectric layer.

12. The method according to claim 8, wherein forming the substrate includes:
forming a layered substrate;
wherein the layered substrate comprises a semiconductor substrate, a plurality of contact pads disposed on the semiconductor substrate, the contact pads being insulated from each other via an insulating material.

13. The method according to claim 12, wherein forming the substrate also includes forming an insulating layer on top of the contact pads.

14. The method of claim 8, wherein defining the second opening comprises a first selective etching process that etches the second layer selectively with respect to the third layer, followed by a second etching process for etching the third layer.

15. A method of forming an integrated circuit comprising a memory device, the method comprising:
forming a device substrate having a surface, the device substrate including a semiconductor substrate;
forming a plurality of access transistors in an array portion, each of the access transistors being at least partially formed in the semiconductor substrate;
forming peripheral circuitry in a peripheral portion, the peripheral circuitry being at least partially formed in the semiconductor substrate;
forming capacitor contacts adjacent to the device substrate surface in the array portion;
forming support contact pads adjacent to the device substrate surface in the peripheral portion;
forming a first layer on the surface of the device substrate;
defining first openings in the first layer, part of the first openings being in contact with the capacitor contacts and part of the first openings being in contact with the support contact pads;
forming a second layer over the first layer;
defining second openings in the second layer in the array portion, the second openings being in contact with the first openings;
defining second openings in the second layer in the peripheral portion, the second openings being in contact with the first openings;
forming a layer covering a surface of the first and second openings in the array portion thereby forming first capacitor electrodes;
forming a dielectric layer covering the first capacitor electrodes;
forming second capacitor electrodes covering the dielectric layer; and
forming a contact fill in the peripheral portion to contact the support contact pads, thereby providing support contacts.

16. The method according to claim 15, further comprising:
filling the first openings with a sacrificial filling prior to forming the second layer.

17. The method according to claim 16, wherein the sacrificial filling and the contact fill comprise the same material.

18. The method according to claim 16, further comprising:
forming a third layer over the first layer after defining the first openings in the first layer and prior to forming the second layer;
wherein the material of the third layer is different from the materials of the first and second layers;
wherein the second openings are defined in the second and third layers.

19. The method according to claim 18, wherein forming the third layer is performed subsequent to filling the first opening with the sacrificial filling.

20. The method according to claim 15, wherein the second openings are defined by an etching process which simultaneously etches the second openings in the array portion and in the peripheral portion.

21. The method according to claim 15, wherein the second openings are defined in the peripheral portion subsequent to providing the first capacitor electrode, the capacitor dielectric and the second capacitor electrode in the array portion.

22. The method according to claim 21, further comprising:
forming a sacrificial fill in the first openings in the array portion prior to forming the second layer; and
forming the contact fill in the first openings in the peripheral portion prior to forming the second layer.

* * * * *